United States Patent [19]

Ohmi et al.

[11] Patent Number: 4,917,136

[45] Date of Patent: Apr. 17, 1990

[54] PROCESS GAS SUPPLY PIPING SYSTEM

[75] Inventors: Tadahiro Ohmi; Kazuhiko Sugiyawa; Fumio Nakahara, all of Sendai; Masaru Umeda, Tokyo, all of Japan

[73] Assignee: Tadahiro OHMI, Miyagi, Japan

[21] Appl. No.: 198,079

[22] Filed: May 24, 1988

[30] Foreign Application Priority Data

May 8, 1988 [JP] Japan ................ 63-111152

[51] Int. Cl.$^4$ .................................... B08B 9/02
[52] U.S. Cl. .......................... 137/15; 134/166 C; 137/240; 222/148
[58] Field of Search ........... 137/238, 240, 1, 15; 134/166 C, 167 C, 168 C, 169 C; 222/148

[56] References Cited

U.S. PATENT DOCUMENTS

| | | | |
|---|---|---|---|
| 4,063,588 | 12/1977 | Thorogood | 137/240 |
| 4,169,486 | 10/1979 | Otteman | 137/240 |
| 4,216,185 | 8/1980 | Hopkins | 137/240 |
| 4,270,564 | 6/1981 | Blackburn et al. | 137/240 |
| 4,281,683 | 8/1981 | Hetherington | 137/240 |
| 4,383,547 | 5/1983 | Lorenz et al. | 137/240 |
| 4,485,840 | 12/1984 | Erwin | 137/240 |
| 4,741,354 | 5/1988 | DeMild, Jr. | 137/240 |

Primary Examiner—George L. Walton
Attorney, Agent, or Firm—Albert L. Jeffers; Anthony Niewyk

[57] ABSTRACT

This invention relates to the supply piping system of the process gas for various types of thin-film making and fine pattern dry etching process, and more particularly to the process gas supply system, which makes it possible to form high quality thin films and to perform high quality etching.

Specifically, when there are a unit in operation with process gas supplied and a unit not in operation with no process gas supplied in a process gas supply piping system, supplying the process gas to two or more process units from a cylinder cabinet piping system, this invention provides a gas supply piping system, where the process gas supply piping line to the process unit not in operation can be purged with purge gas all the time and where gas flows all the time through all of gas supply piping lines to eliminate the stagnation of gas.

24 Claims, 22 Drawing Sheets

PRIOR ART

PROCESS GAS SUPPLY PIPING SYSTEM

DETAILED DESCRIPTION OF THE INVENTION

Technical Background

This invention relates to the supply piping system of the process gas for various types of thin-film making and fine pattern dry etching process, and more particularly to the process gas supply system, which makes it possible to form high quality thin films and to perform high quality etching.

Prior Art

In recent years, high importance is placed more and more on the technique to produce the process atmosphere of ultra-high purity, i.e. to provide the gas of ultra-high purity to the process equipment, in the process of high quality thin-film making or of fine pattern dry etching.

Taking a semiconductor device as an example, the unit element has become smaller and smaller in size to enhance the degree of integration in an integrated circuit, and extensive research and development programs are being carried out to commercialize the semiconductor devices of micron or submicron order, or even of 0.5 $\mu$m or less. Such devices are produced by repeatedly performing a thin-film making process and a process to etch these thin films into the given circuit patterns, where a silicon wafer is normally placed in a reaction chamber under the vacuum atmosphere filled with a given gas. The reaction chamber is kept under reduced pressure to obtain a longer mean free path of the gas molecules for etching and filling the through-holes and the contact-holes of a high aspect ratio and also to provide the proper control of the vapor-phase reactions. Impurities present in these processes cause several problems, such as degradation of the thin films, lower accuracy of the fine structures, lower selection ratio in the etchings between different types of materials, and insufficient adhesion of the thin films. It is essential to have the reaction environment for film making and etching under full control in order to produce the integrated circuits of submicron or lower submicron patterns on large-size wafer at high density and with high yield. This requires a technique that can supply a gas of ultra-high purity for the process.

The gases used for semiconductor production may be roughly divided into two categories: The relatively stable common gases such as $N_2$, Ar, He, $O_2$, and $H_2$, and the special gases which are either strongly toxic, spontaneously combustible or corrosive, such as $AsH_3$, $PH_3$, $SiH_4$, $Si_2H_6$, HCl, $NH_3$, $Cl_2$, $CF_4$, $SF_6$, $NF_3$ and $WF_6$. The common gases of the first category are usually sent directly from the purification unit to the semiconductor production unit, since they can be handled relatively in easy manner. The development and improvement of the better storage, purification and piping systems have made it possible to supply these gases directly from the purification unit to the semiconductor production unit. (Tadahiro Ohmi: "Challenges to ppt—Gas Piping System for Semiconductor Production, Challenging the ppt Impurities Concentration", Nikkei Micro-Devices, pp. 98–119, July, 1987). On the other hand, the gases of the second category are mostly sent from cylinders to the production unit via a cylinder cabinet piping system since they must be handled with much more care and are used in smaller quantities.

The most serious problems associated with the gas supply from the cylinder via cylinder cabinet piping system come from the contamination of the gases caused by stains on the internal walls, the leaks at the valve-cylinder connections and the large quantities of gases adsorbed on the internal walls of cylinder valve which permits no cleaning. These problems, however, have been mostly solved by the combined electro-polishing of the internal walls, finishing them to mirror surfaces free of the fabrication-related degradation, and by the development of an external screw type cylinder valve, in which MCG (metal C ring fitting) incorporating a purge valve is used. (Tadahiro Ohmi and Junichi Murota: "Clean Cylinders and Gas Filling Technology"; Proceedings of 6th Ultra LSI Ultraclean Technology Symposium; "High-Performance Process Technology III", pp. 109–128, January, 1988.) Further, the entire piping line of the cylinder cabinet piping system was divided into two layers to the atmosphere, and the purge gas supply line was designed in such structure as to facilitate the purging all the time in order to reduce the contamination of the discharged gas by the mingling of the atmospheric air air into the piping system and by the moisture from internal walls of the piping materials. The development of such system has actualized the supply of the gas of ultra-high purity.

For the supply of such process gas, a cylinder cabinet piping system corresponding to the process unit is installed so that process gas can be supplied from one gas cylinder to one process unit. In this case, there is substantially no problem because the process gas supply line can be purged with the purge gas supplied to the cylinder cabinet piping system. However, when two or more of the units requiring many gas cylinders (such as reactive ion etching unit (RIE) or electronic cyclotron resonance unit (ECR)) are installed, there are many cases, where the material gas must be supplied through the branch piping from one gas cylinder to two or more process units because of the space requirements of cylinder cabinet piping system or of the cost. There is no problem with the unit, where process gas is flowing. In case of the unit where process gas is not used, the gas is sealed in the process gas supply line to such unit and the gas is contaminated with the released gas and moisture coming from internal walls of the piping materials, and this caused the decrease of purity in the process gas thus supplied. Also, when process gas is supplied to two or more process units, and the supply of process gas to one process unit is stopped for example, the process gas cannot be purged with the purge gas of the gas supply system, and the process gases with highly toxic or corrosive property remain there. Specifically, in the conventional system, there is not only the problem of contamination of process gas supply line but also the problem of danger.

Such contamination of the piping system due to the stopping of the gas flowing in the gas piping system and the decrease of the purity of the supplied gas exert serious influence to the process.

For example, the newly developed DC-RF coupled bias sputtering device gives excellent, mirror-surfaced Al thin films which are completely free of hillocks, even when they are thermally treated at 400° C. (T. Ohmi, H. Kuwabara, T. Shibata and T. Kiyota: "RF-DC Coupled Mode Bias Sputtering for ULSI Metalization"; Proceedings of 1st Int. Symp. on Ultra Large Scale Integration Science and Technology; May 10–15, 1987, Philadelphia, and T. Ohmi: "Complete Removal of Impurities; Grasp of Hillock-Free Al Film-Making Conditions"; Nikkei Micro-Devices, pp. 109–111, October, 1987.) In the production of Al thin films using the above device, it is known that the optimal condition to manufacture Al films can be obtained only when the moisture content in Ar can be reduced to less than 10 ppb or less. The presence of moisture of 10 ppb or more in the Ar sputtering atmosphere will degrade the surface morphologies of the Al thin films. It is impossible, therefore, when the moisture is present beyond the above level, to optimize the film-making conditions for the production of the hillock-free Al thin films whose surface resisticity is the same as that of the bulk Al body.

Further, it has been found that vacuum CVD, which was before considered to be incapable to grow Si thin film selectively and epitaxially under the commercial conditions (650° C. and several Torr), allows the selective and epitaxial growth, provided that the moisture adsorbed on wafer is sufficiently controlled by using $SiH_4$, $H_2$ and $N_2$ gases with ultra-high purity containing moisture of 10 ppb or less. Thus, Si can be epitaxially grown on a clean Si surface, whereas the growth of polysilicon on $SiO_2$ can be efficiently controlled. (Junichi Murota, Naoto Nakamura, Manabu Kato, Nobuo Mikoshiba and Tadahiro Ohmi: "Highly Selective, Ultra-Clean CVD Technology", 6th Ultra LSI Ultra-Clean Symposium; "High-Performance Process Technology III", pp. 215–226, January, 1988.)

FIG. 21 represents the flow of one of the most well-arranged, conventional piping system to supply process gas from cylinder cabinet piping system to the process unit. In general, a cylinder cabinet piping system has 3 to 6 cylinders, and 100 to 200 units of such piping systems are usually installed for the production line in a semiconductor factory. However, there are many cases where, because of space requirements and installation cost, process gas must be supplied from one gas cylinder to two or more (e.g. two to four) process units.

Description is now made referring to FIG. 21. For easier explanation, one gas supply line from cylinder cabinet piping system to the process unit is shown in FIG. 21. In FIG. 21, 1, 2 and 3 represent the process units and 4, 5 and 6 show the control units to control the pressure and flow rate of the gas to be supplied. 7 indicates a cylinder cabinet piping system to supply cylinder gas in gas cylinder to the process units. 8, 9, 10, 11, 12, 13, 14, 15, and 17 are stop valves. Two-throw three-way valves are usually used in 8 and 10, 9 and 11, 12 and 15, 13 and 16, and 14 and 17, combining two valves in one integral unit. 18, 18' and 18" are process gas supply piping lines, and 19, 20 and 21 are the pipings to discharge the purge gas and are connected to exhaust ducts or exhaust equipment respectively. Usually, 18, 18', 18", 19, 20 and 21 consist of ¼" electro-polished SUS316L pipe.

In the following, the functions and operation of the system shown in FIG. 21 will be described.

First, the supply of process gas is described. In order to obtain uniform concentration of the process gas supplied to the process unit, the purge gas (e.g. Ar gas) remaining in the supply piping system must be replaced with the process gas. When process units 1, 2 and 3 are not used, purge gas (e.g. Ar) for gas piping system is supplied from cylinder cabinet piping system 7. With the valves 8, 9, 10, 11, 15, 16 and 17 opened and the valves 12, 13 and 14 closed, the piping system is purged with purge gas up to just before the process units all the time. Taking now an example in the case where process gas is supplied to the process unit 1, process gas is supplied to the process gas supply piping line 18 with the valves 10, 12 and 15 closed and with the valve 8 opened. Then, the process gas supply valve in the cylinder cabinet piping system 7 is closed, and the valve 15 is opened to release the gas in the process gas supply piping line 18. The filling and releasing of the process gas to and from the process gas supply piping line 18 are repeated for three times or more to replace the contents of the piping line with process gas. Then, the valves 10 and 15 are closed, and 8 and 12 are opened, supplying the process gas in the cylinder cabinet piping system 7 to the process unit under the proper control by the control unit 4.

Next, the procedure to stop the process gas supply is described. The procedure is the same as that of the process gas supply. Instead of replacing the purge gas with process gas, the process gas in the process gas supply piping line 18 is replaced with the purge gas (e.g. Ar gas) in the cylinder cabinet piping system 7. After replacing with purge gas, it is desirable to send the purge gas as practical as possible in order to eliminate the influence of the released gas containing mostly moisture coming from internal walls of the piping materials.

Problems to be Solved by the Invention

In the system shown in FIG. 21, the purge gas should not be sent into the process gas supply piping lines 18' and 18" leading to the process units 2 and 3 when, for instance, process gas is to be supplied to the process unit 1 only. Therefore, these lines must be completely closed. Similarly, when process gas is to be supplied to the process gas supply piping line 18" leading to the process unit 3, and the line must be completely closed. Specifically, when process gas is supplied to one or two process units at the same time, the process gas supply piping line leading to the process unit(s) not in use must be closed. When the gas supply piping line is completely closed in such case, the interior of the piping line is contaminated with the released gas containing moisture coming from internal walls of the piping materials.

FIG. 22 shows the changes of dew point when such gas piping system is closed. In case gas flow is started again after stopping the gas supply for 9 days in a system where dew point of the gas had been decreased as low as −98° C. by baking of the supply piping line, dew point of the gas is increased to −42° C., and it takes more than 3 days until the original value is restored. This means that the closing of gas supply piping system results in the contamination of the piping system, and this creates a big problem in the gas supply system for the process units, which require the gases of ultra-high purity.

In the conventional system as shown in FIG. 21, the replacement with purge gas cannot be performed when process gas is supplied to two or more process units at the same time or when the supply of process gas is to be stopped to one of these units.

Consequently, when process gas is supplied through branch pipings to two or more (e.g. three or four) process units from one cylinder, there has been a strong demand on a new system technique, which makes it possible to independently purge the branch pipings to each of the process units and to continuously pass the purge gas all the time to eliminate gas stagnation.

It is the object of the present invention to solve such problems and to provide the process gas supply piping system, which can independently pass the gas through each of process gas supply piping line to eliminate the stagnation of the gas in each of the branch pipings when the process gas supply piping lines are used with branch pipings.

Means to Solve the Problems

The present invention provides, in a gas piping system to supply process gas to at least two or more process units from a process gas supply piping line, a system comprising a purge gas piping line, which can independently purge each of the process unit piping lines branched off from the said process gas supply piping line, wherein at least four valves are used to connect the branch points of said process gas supply piping line and said process unit piping line with said purge gas piping line.

Operating Principle

Specifically, when there are a unit in operation with process gas supplied and a unit not in operation with no process gas supplied in a process gas supply piping system, supplying the process gas to two or more process units from a cylinder cabinet piping system, this invention provides a gas supply piping system, where the process gas supply piping line to the process unit not in operation can be purged with purge gas all the time and where gas flows all the time through all of gas supply piping lines to eliminate the stagnation of gas.

When the gas supply piping system according to the present invention is used in combination with the newly developed clean gas cylinder for semiconductor (Japanese Patent Application No. 63-5389) and the cylinder gas cabinet piping system (Japanese Patent Application No. 63-52457), it is possible to supply the process gas of ultra-high purity with moisture content of 10 ppb or less to the process units all the time.

Here, the newly developed clean gas cylinder for semiconductor is described as follows:

(1) A unit fabricated mostly from stainless steel, wherein at least a part of the surface of said stainless steel exposed to the interior of the unit comprises a layer mostly consisting of chrome oxide formed in the vicinity of boundary surface between stainless steel and passive state film and, further, a layer mostly consisting of iron oxide in the vicinity of the surface of passive state film, and the passive state film with thickness of more than 50 Å is formed by heating and oxidizing the stainless steel at the temperature of 150° to 400° C.

(2) A unit fabricated mostly of stainless steel, wherein, in at least a part of the surface of said stainless steel exposed to the interior of the unit, the passive state film with thickness of more than 100 Å, consisting mostly of mixture of chrome oxide and iron oxide, is formed by heating and oxidizing the stainless steel at the temperature of 400° to 500° C.

(3) A unit fabricated mostly of stainless steel, wherein, in at least a part of the surface of said stainless steel exposed to the interior of the unit, a passive state film with thickness of more than 130Å, consisting mostly of chrome oxide, is formed by heating and oxidizing the stainless steel for more than 9 hours at the temperature of 550° C. or more.

Particularly, the surface of the stainless steel with the passive state film should have such flatness that the maximum difference of the height between the convexed and concaved portions within a circle with 5 $\mu m$ radius is 1 $\mu m$ or less.

When clean $SiH_4$ and $Si_2H_6$ gases with lesser impurities are used in such new technique, the epitaxial growth temperature of Si can be decreased as low as 600° C, and obvious selectively is given in the silicon deposit on Si and $SiO_2$. (Mizuho Morita, Akinobu Koji, Tadahiro Ohmi, Hironada Kumagai, and Masaki Itoh: "Free Molecule Flow Irradiation Type Low Temperature High-Speed CVD Technique", 6th Ultra LSI Ultra-Clean Technology Symposium, "High-Performance Process Technique III", pp 229–243, January 1988, and Junichi Murota, Naoto Nakamura, Manabu Katoh, Nobuo Mikoshiba and Tadahiro Ohmi: "Highly Selective Ultra-Clean CVD Technique", ditto, pp. 215–226.) Thus, this invention provides a total and clean system for the raw material gas supply lines for the production of high quality thin film and high quality etching.

1, 2, and 3 . . . Process units; 4, 5, and 6 . . . Control units; 7 . . . Cylinder cabinet piping system; 8, 9, 10, 11, 12, 13, 14, 15, 16 and 17 . . . Stop valves; 18, 18' and 18" . . . Process gas supply piping lines; 19, 20 and 21 . . . Purge gas exhaust lines; 101 . . . Process units; 102 . . . Piping connection fitting; 103 . . . Two-throw three-way valve; 104 . . . Process gas supply piping line; 105 . . . Purge gas exhaust line; 201, 202 and 203 . . . Process units; 204, 205 and 206 . . . Control units; 207 . . . Cylinder cabinet piping system; 208, 209, 210, 211, 212, 213, 214, 215, 216, 217, 218, 219, 220, 221, 227 and 232 . . . Stop valves; 222, 222' and 222" . . . Process gas supply piping lines; 223 . . . Purge gas supply piping line; 224 and 229 . . . Spiral pipes; 225 and 230 . . . Needle valves; 226 and 231 . . . Flowmeters; 301, 301 and 303 . . . Process units; 304, 305 and 306 . . . Control units; 307 . . . Cylinder cabinet piping system; 308, 309, 310, 311, 312, 313, 314, 315, 316, 317, 318, 319, 325 and 330 . . . Stop valves; 323 and 328 . . . Needle valves; 324 and 329 . . . Float type flowmeters; 322 and 327 . . . Spiral pipes; 320 . . . Process gas supply piping line; 321 . . . Purge gas supply piping line; 326 and 331 . . . Purge gas exhaust lines; 326 and 331 . . . Purge gas exhaust lines; 401, 402, 403, and 404 . . . Stop valves; 405 . . . Process gas supply piping line; 406 and 407 . . . Line to supply process gas; 408 . . . Purge gas supply piping line; 409 . . . Purge gas exhaust line; 501, 502, 503, 504, 505, 506, 507 and 508 . . . Stop valves; 509 . . . Process gas supply piping line; 510, 511, 512 and 513 . . . Lines to supply process gas; 514 . . . Purge gas supply piping line; 515 . . . Purge gas exhaust line.

PREFERRED EMBODIMENTS

The features and the advantages of the present invention will be described below in conjunction with the drawings.

Embodiment 1

Figure 1:
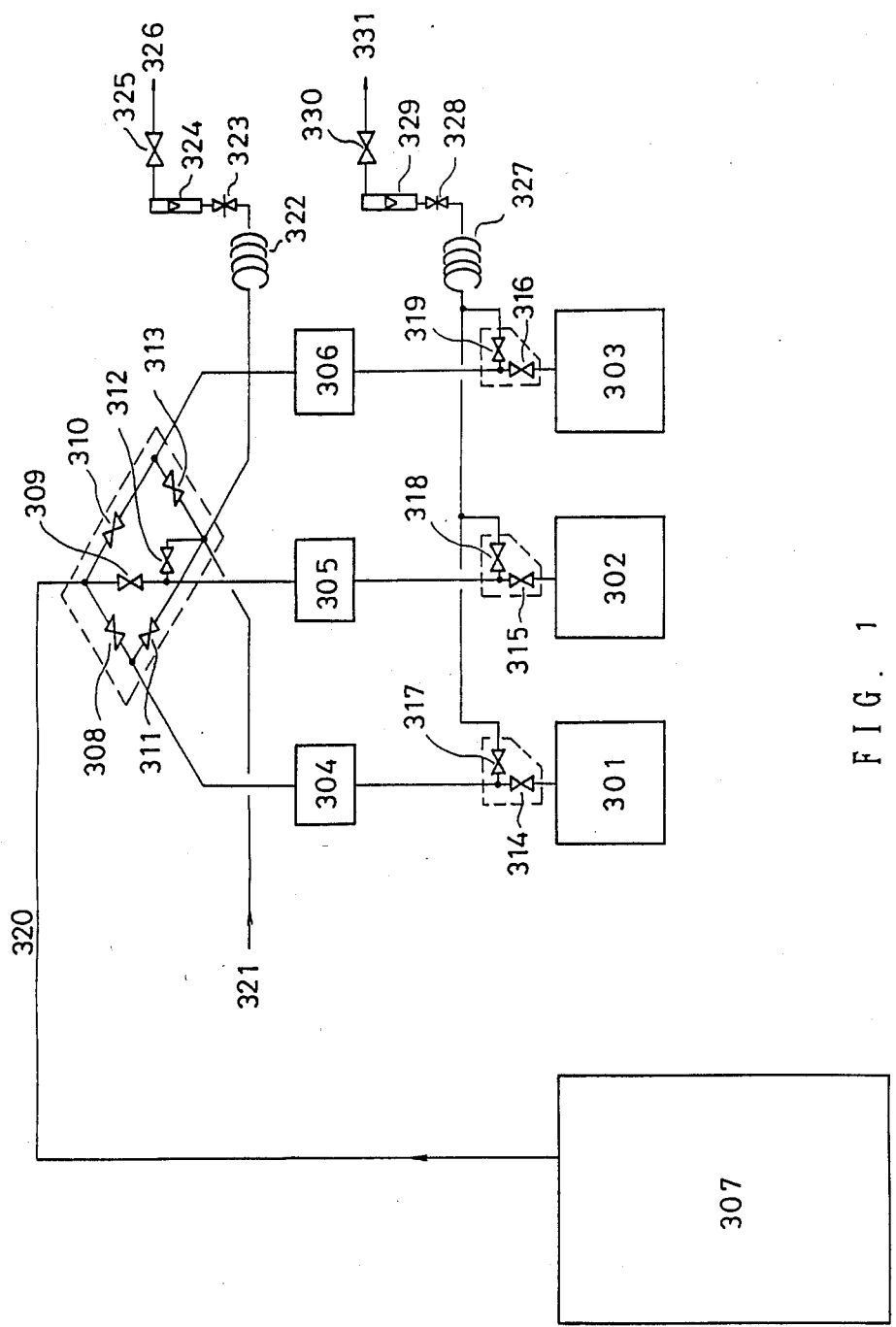
FIG. 1 represents the embodiment 1 of the process gas supply piping system according to the present invention.

FIG. 1 is a piping diagram of a gas supply piping system showing the embodiment 1 according to the present invention. Three process units are used in this embodiment, but only one process gas supply piping line is depicted in the drawing to facilities the explanation. 301, 302 and 303 are the process units, and 304, 305 and 306 are the control unis to control process gas to be supplied to the process units. 307 is a cylinder cabinet piping system for process gas supply. 308, 309, 310, 311, 312, 313, 314, 315, 316, 317, 318, 319, 325 and 330 are stop valves. Of these valves, 308, 309, 310, 311, 312 and 313 are mono-block valves, in which 6 valves are combined into one integral unit to minimize gas stagnation. 314 and 317, 315 and 318, and 316 and 319 are two-throw three-way valves, in each of which two valves are combined into one integral unit. 323 and 328 are needle valves, and 324 and 329 are float type flowmeters. 323 and 324, and 328 and 329 may be either an integrated float type flowmeter with needle valve or a mass flow controller respectively. It is desirable to use the internally electro-polished materials for these units to eliminate particle generation and external leak as well as to minimize the released gas. 322 and 327 are spiral pipes to prevent the mingling of the atmospheric air coming through the release outlet of purge gas through back-diffusion. It is desirable to use a ¼" internally electro-polished SUS316L pipe with length of about 4 m for this purpose. 320 is a process gas supply piping line to the process units 301, 302 and 303 from the cylinder cabinet piping system 307. 321 is a supply piping line of purge gas such as Ar, and 326 and 331 are purge gas exhaust lines. Each of these lines are fabricated of ¼" or ⅜" internally electro-polished SUS315L pipes depending upon the quantity of the flowing gas. When the flowing gas is of chlorine or fluorine type with highly corrosive property, Ni piping may be used. For the purge gas exhaust line 331, three lines are combined together into one, but they may be independently furnished.

Next, the functions and operation of the system shown in FIG. 1 will be described. The purge gas supply piping line 321 should be designed in such structure that purge gas can be passed through all the time to prevent the decrease of purge gas purity due to the released gas containing moisture from internal walls of piping materials. For example, in case of spiral pipe 322 with pipe diameter of ¼" and with length of 4 m, the needle valve 323 and the float type flowmeter 324 should be adjusted to have gas flow rate of 1 liter/min. or more in order to prevent the mingling of the atmospheric air through the release outlet by reverse diffusion and to provide the flow of purge gas with high purity with lower flow rate all the time through the purge gas supply piping line 321. This makes it possible to supply the purge gas of high purity, maintaining the impurity level of purge gas to at least less than several ppb.

Figure 2:
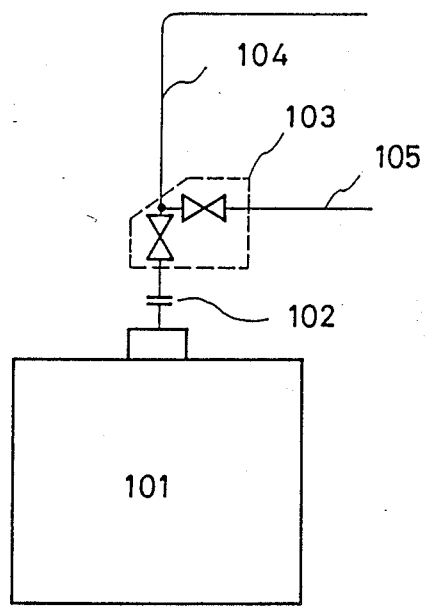
FIG. 2 shows the detailed piping procedure of the process gas supply piping system to the process units.

FIG. 2 illustrates the method to connect each supply piping to the process unit. 101 represents a process unit. 102 is a pipe connection fitting, and it is desirable to use a connection fitting made of metal C ring to eliminate particle generation and external leakage. 103 is a two-throw three-way valve as mentioned above, and 104 is a process gas supply piping line. 105 is a purge gas exhaust line, and is made of the internally electro-polished SUS316L pipe. When the flowing gas is of chloride or fluorine type with high corrosive property, Ni piping may be used.

In the process unit 101, the pipe connection fitting 102 is often removed for maintenance purpose. In such case, elbows are used in the process gas supply piping line 104 and the purge gas exhaust line 105 as shown in the process gas supply piping line 104 in order to furnish horizontal portion to the supply inlet of the process unit for providing higher degree of freedom and to completely separate the pipe connection fitting 102. Or, spiral piping with larger radius of curvature or flexible piping may be used for the process gas supply piping line to prevent the generation of particles. In so doing, it is possible to supply gas to the process units through all-metallic piping systems, to freely remove or attach the piping systems during equipment maintenance, and to continuously pass the purge gas through the gas piping systems even during maintenance.

Next, the operating procedure of the gas supply piping system of FIG. 1 will be described.

Figure 4:
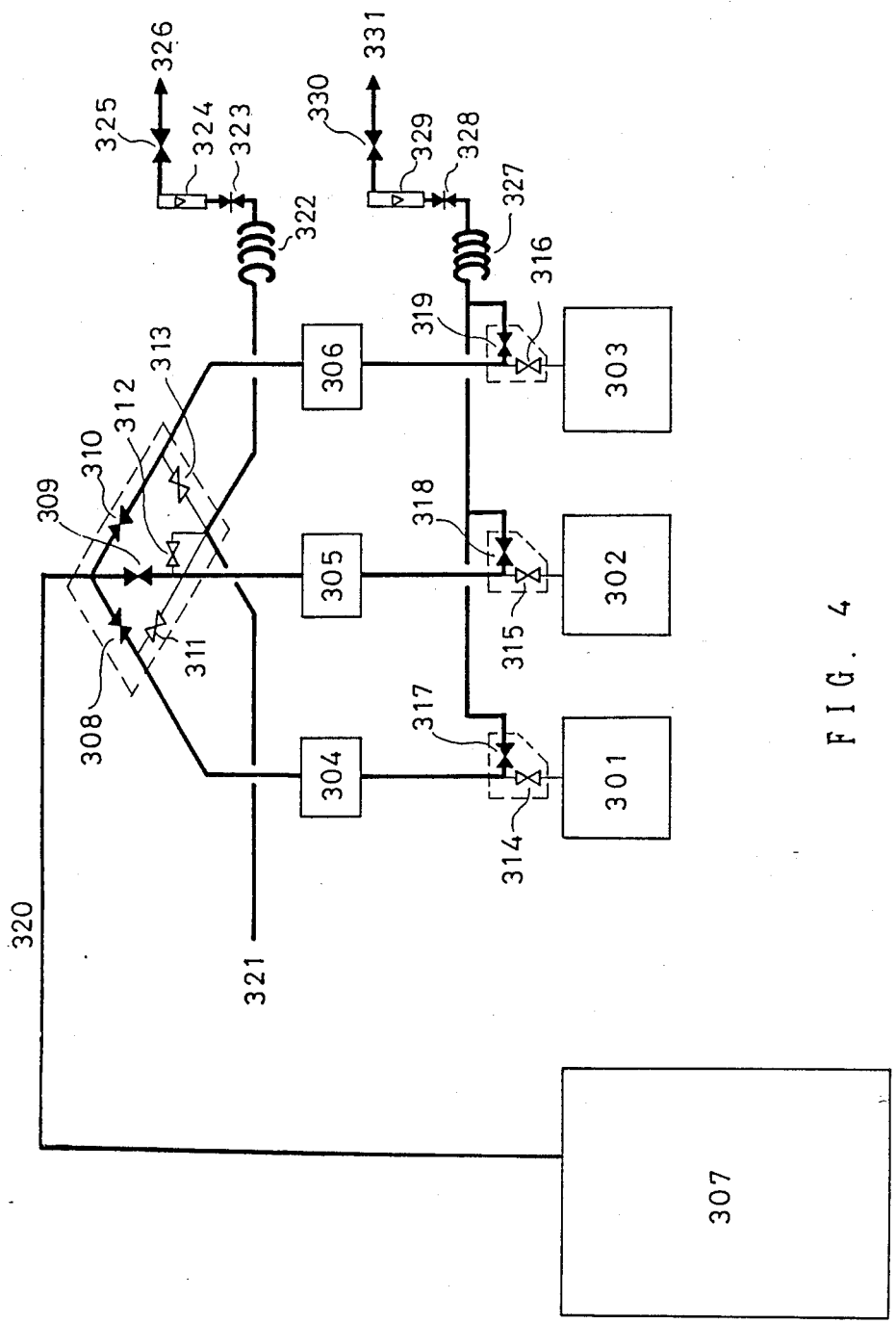
FIGS. 4 through 11 are the drawings to illustrate the operations in the process gas supply piping system according to the invention and shown in FIG. 1.

FIG. 4 shows the flow of purge gas when all process units are stopped. The lines with flowing gas are shown by thick, black lines. Purge gas such as Ar is supplied from the cylinder cabinet piping system 307. With the valves 308, 309, 310, 317, 318, 319 and 330 opened and the valves 311, 312, 313, 314, 315 and 316 closed, purge gas is sent by small quantity. Purge gas is sent at 1 liter/min. or more through the purge gas supply piping line 321 with the valve 325 opened.

Figure 15:
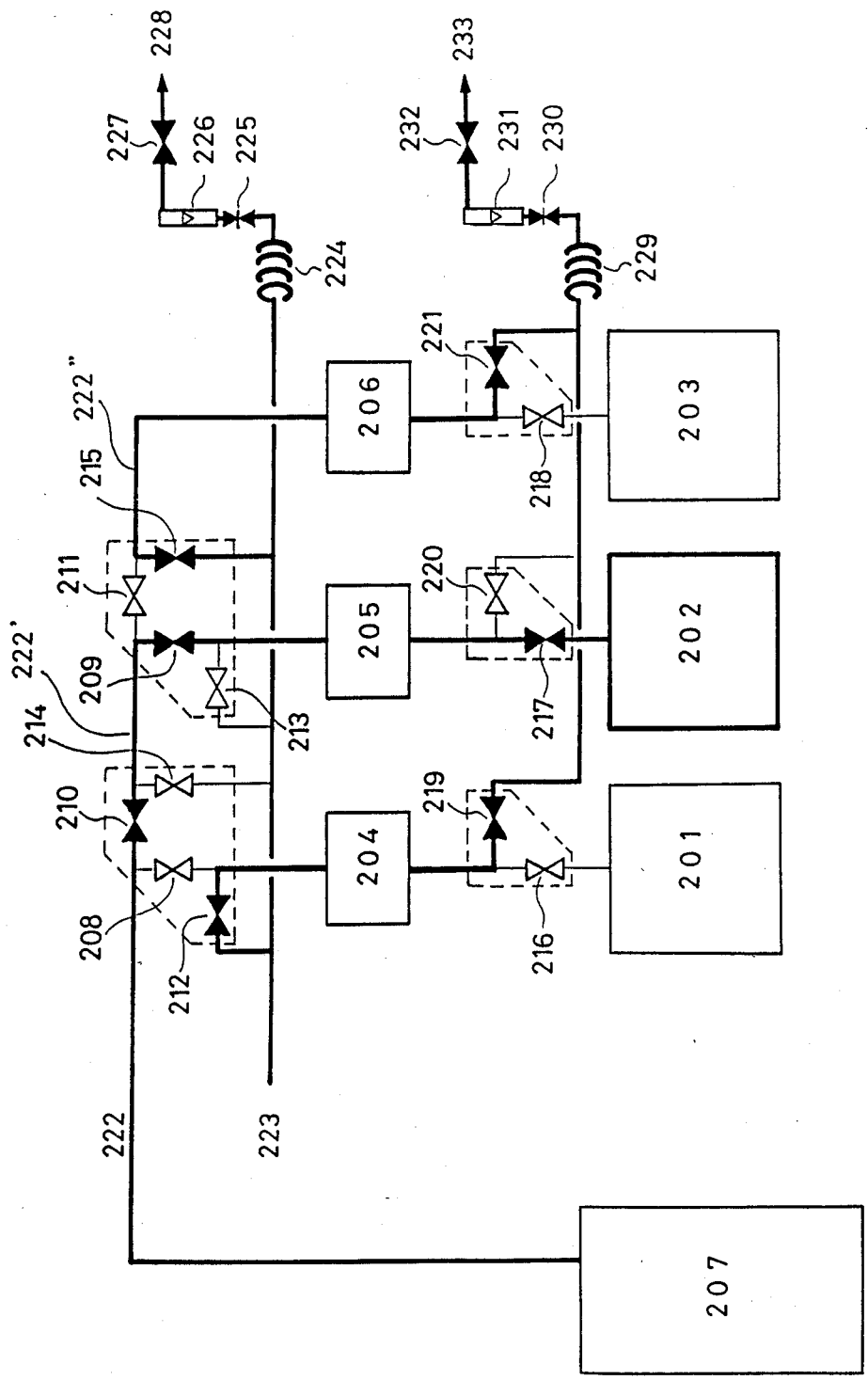

Next, explanation is given on the supply of process gas to each unit. The lines with flowing gas are shown by thick, black lines. FIG. 15 illustrates the status, where process gas is supplied only to the process unit 301. With the valves 309, 310, 311 and 317 closed and the valves 308 and 314 opened, process gas is supplied from the cylinder cabinet piping system 307 through the process gas supply piping line 320 and control unit 304 to the process unit 301. With the valves 312, 313, 318, 319 and 330 opened and the valves 315 and 316 closed, purge gas is supplied from the purge gas supply piping line to the process gas supply piping line 321 leading to the process units 302 and 303. Purge gas is released at the flow rate of 1 liter/min. or more to the purge gas exhaust line to purge the process gas supply piping line all the time. Also, gas is passed all the time through purge gas supply piping line 321 to the purge gas exhaust line 326 at the flow rate of 1 liter/min. as shown in FIG. 4 to prevent the stagnation of gas.

Figure 6:
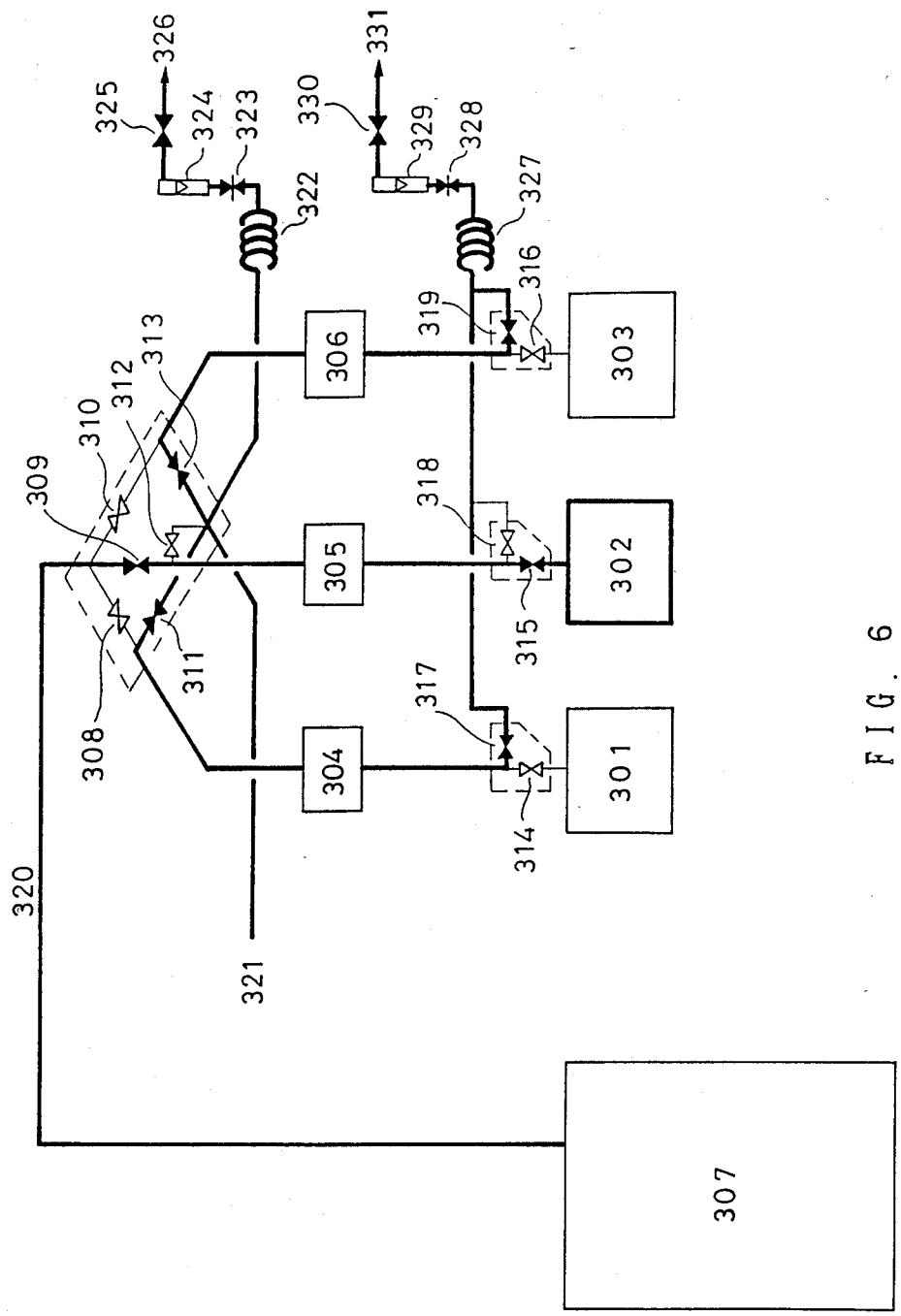

FIG. 6 shows the flow of gas when process gas is supplied only to the process unit 302. With the valves 308, 310, 312 and 318 closed and the valves 309 nd 314 opened, process gas is supplied from cylinder cabinet piping system 307 through process gas supply piping line 320 and control unit 305 to the process unit 302. With the valves 311, 313, 317, 319 and 330 opened and the valves 314 and 316 closed, purge gas is supplied from purge gas supply piping line 321 to the process gas supply piping line leading to the process units 301 and 303. Purge gas is released to the purge gas exhaust line 331 at the flow rate of 1 liter/min. or more to perform the purging all the time.

Figure 5:
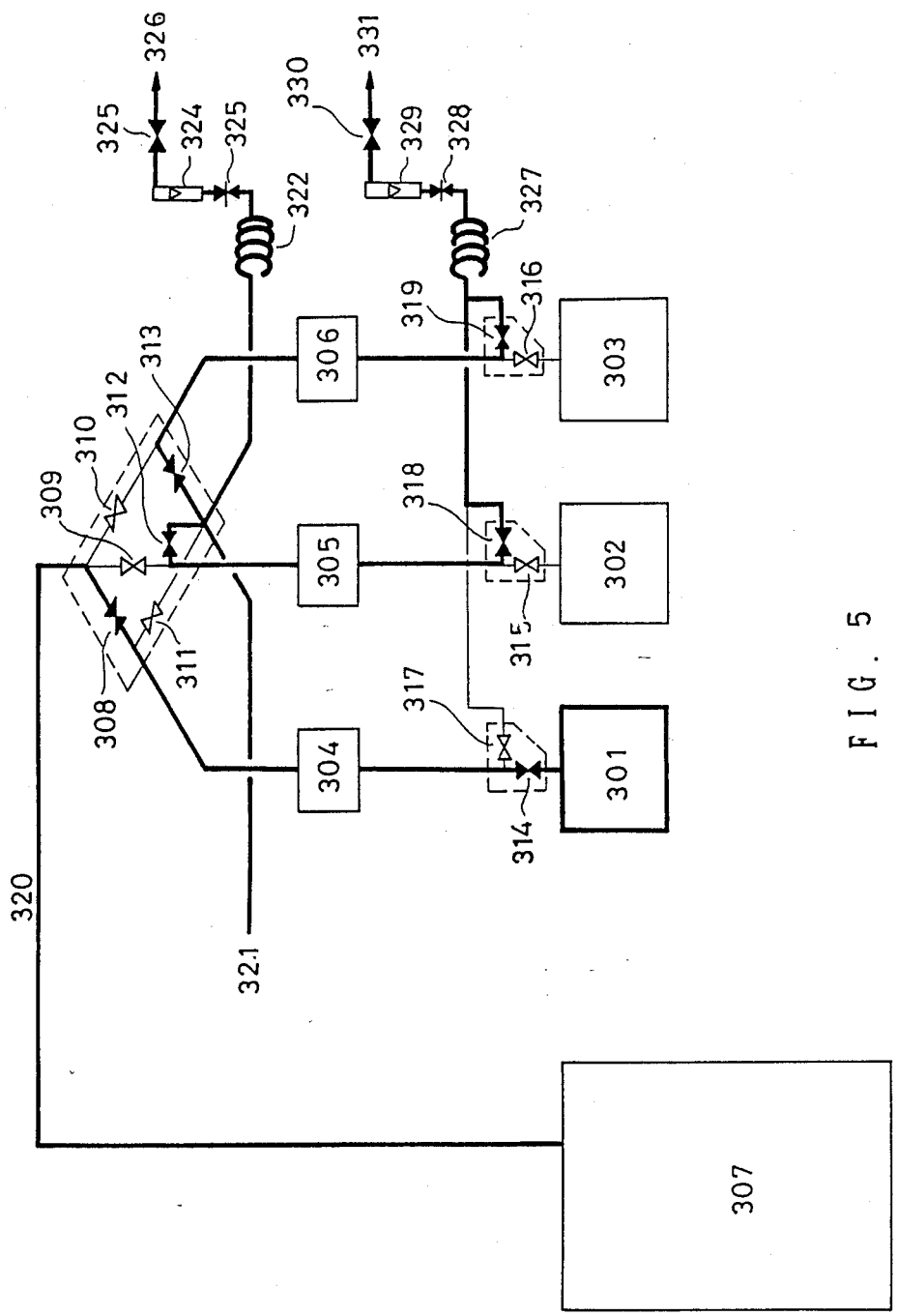
Figure 7:
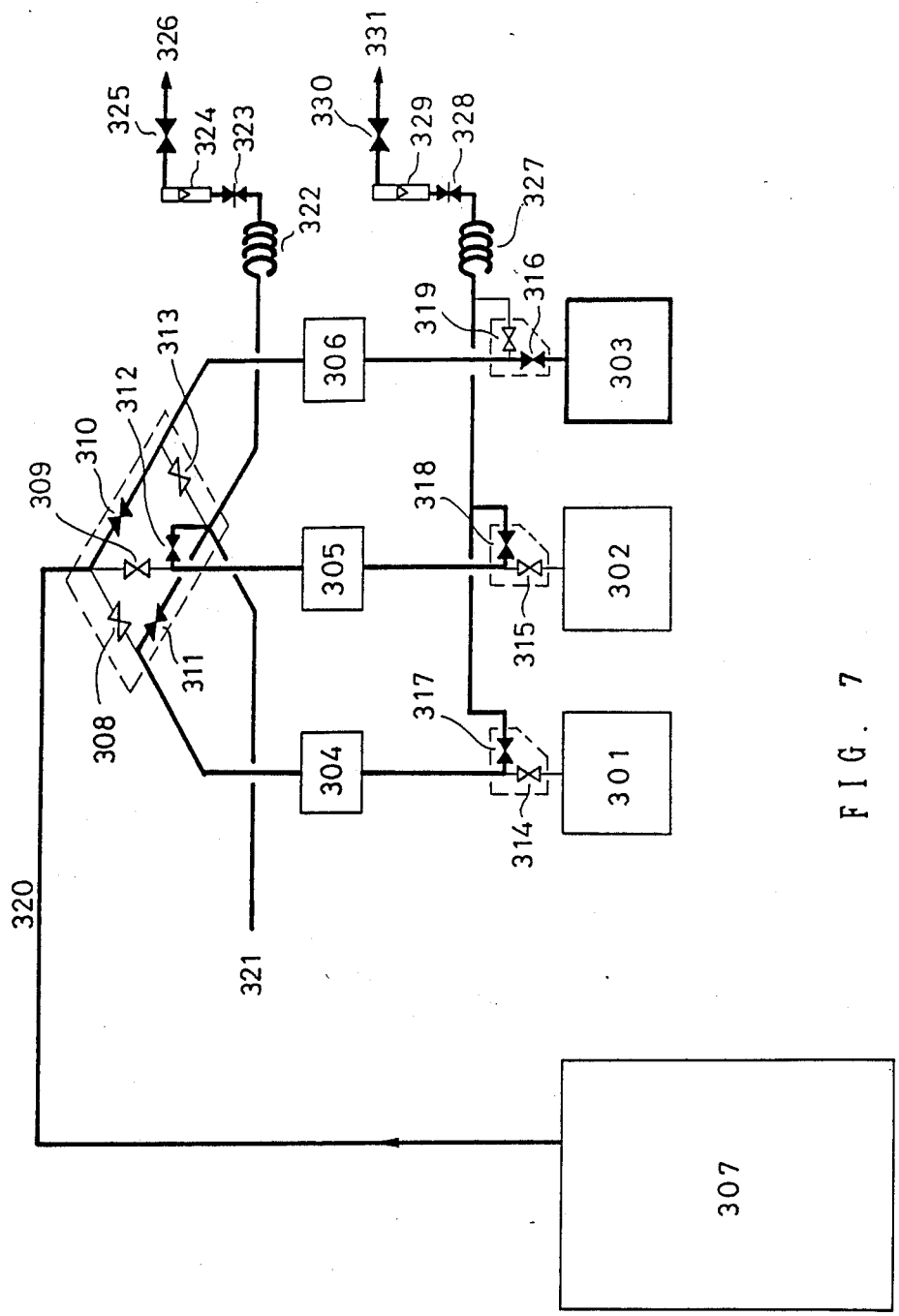

FIG. 7 illustrates the flow of gas when process gas is supplied only to the process unit 303. With the valves 308, 309, 311, 312 and 319 closed and the valves 310 and 316 opened, process gas is supplied to the process unit 303. With the valves 311, 312, 317, 318 and 330 opened and the valves 313, 314 and 315 closed, purge gas is supplied to the process gas supply piping line leading to the process units 301 and 302 to perform purging all the time. Just as in the case of FIG. 5, purge gas is sent to purge gas exhaust line 326 in the systems shown in FIGS. 6 and 7 to perform the purging all the time and to prevent the stagnation of gas.

Figure 8:
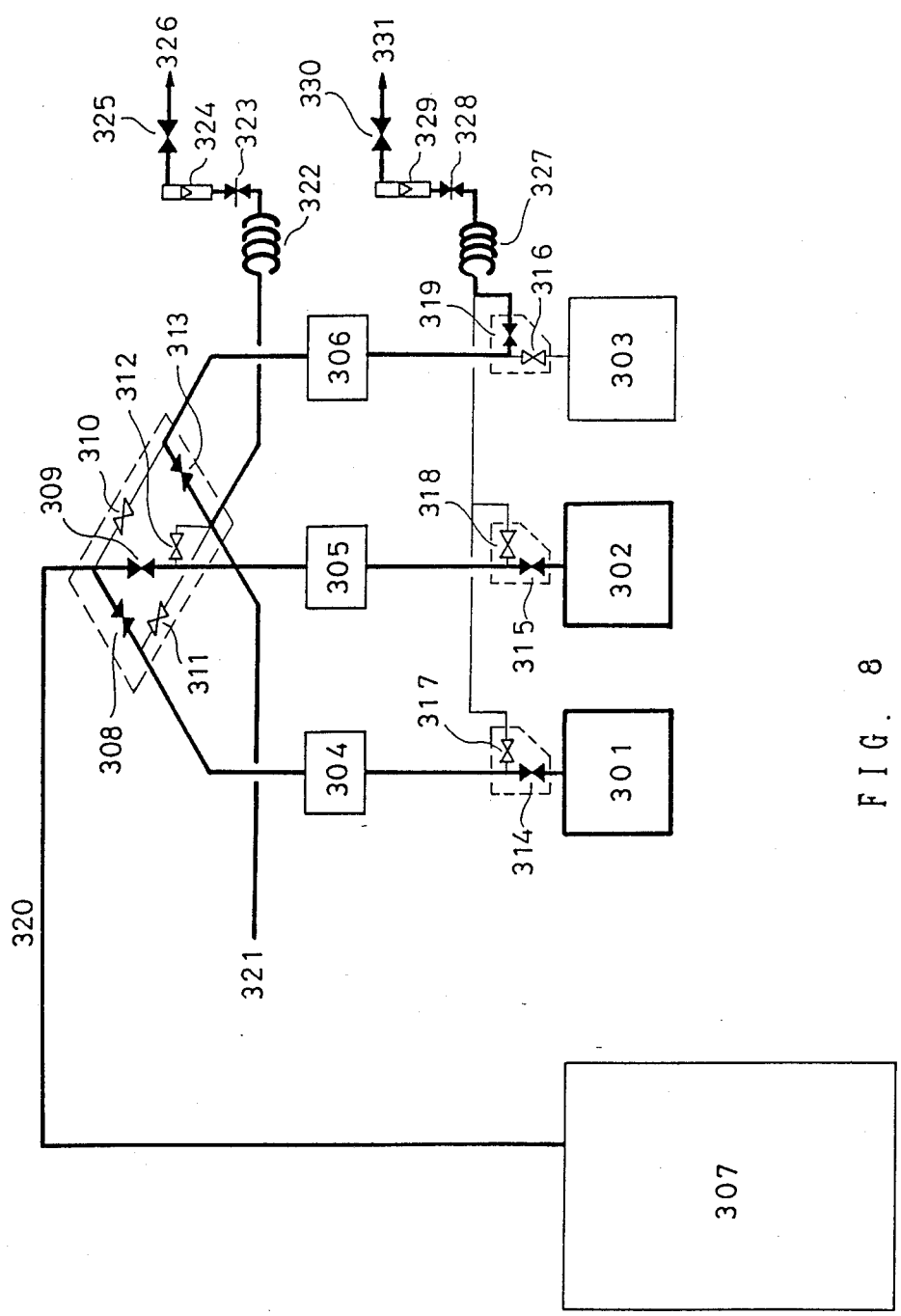
Figure 9:
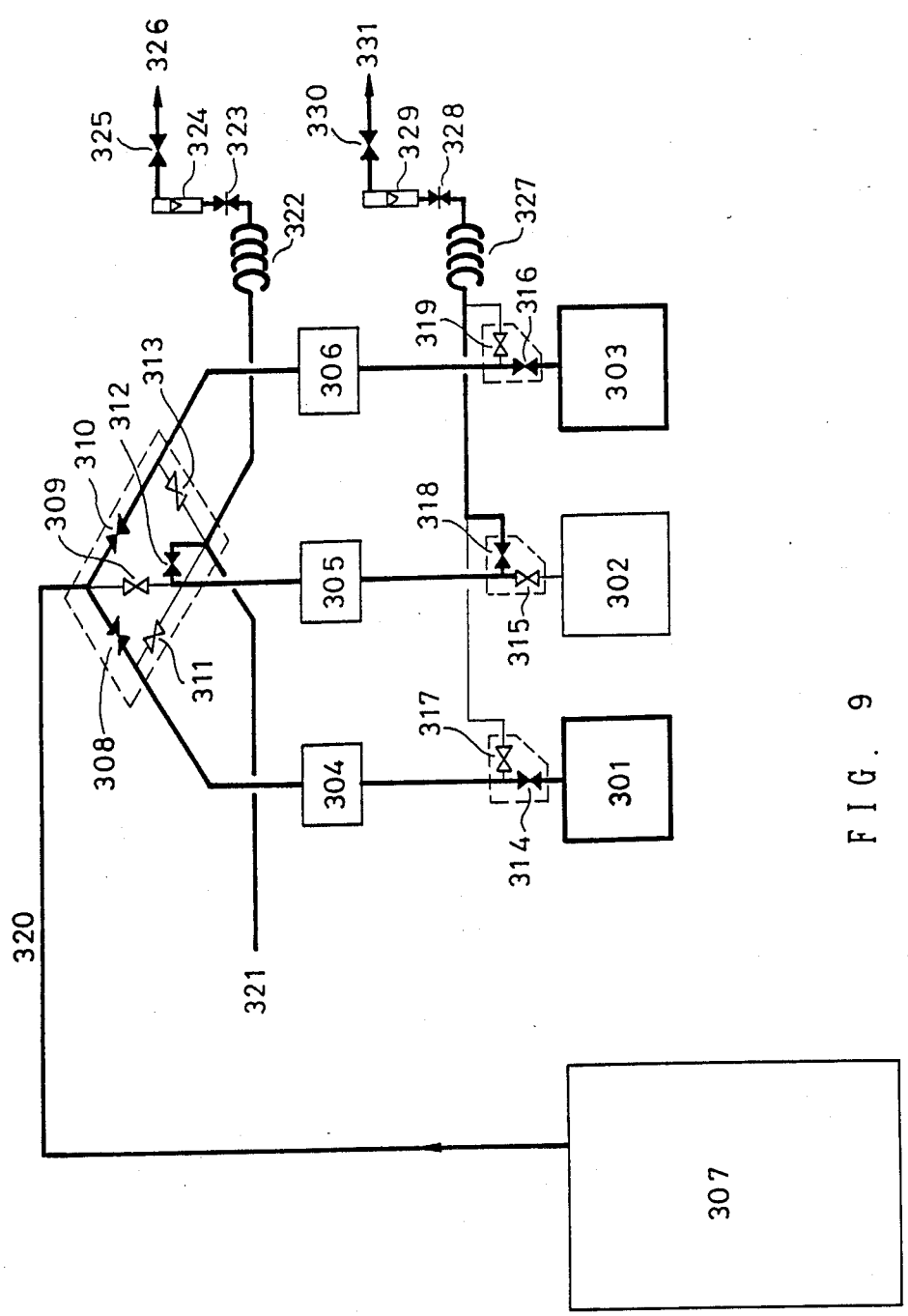
Figure 10:
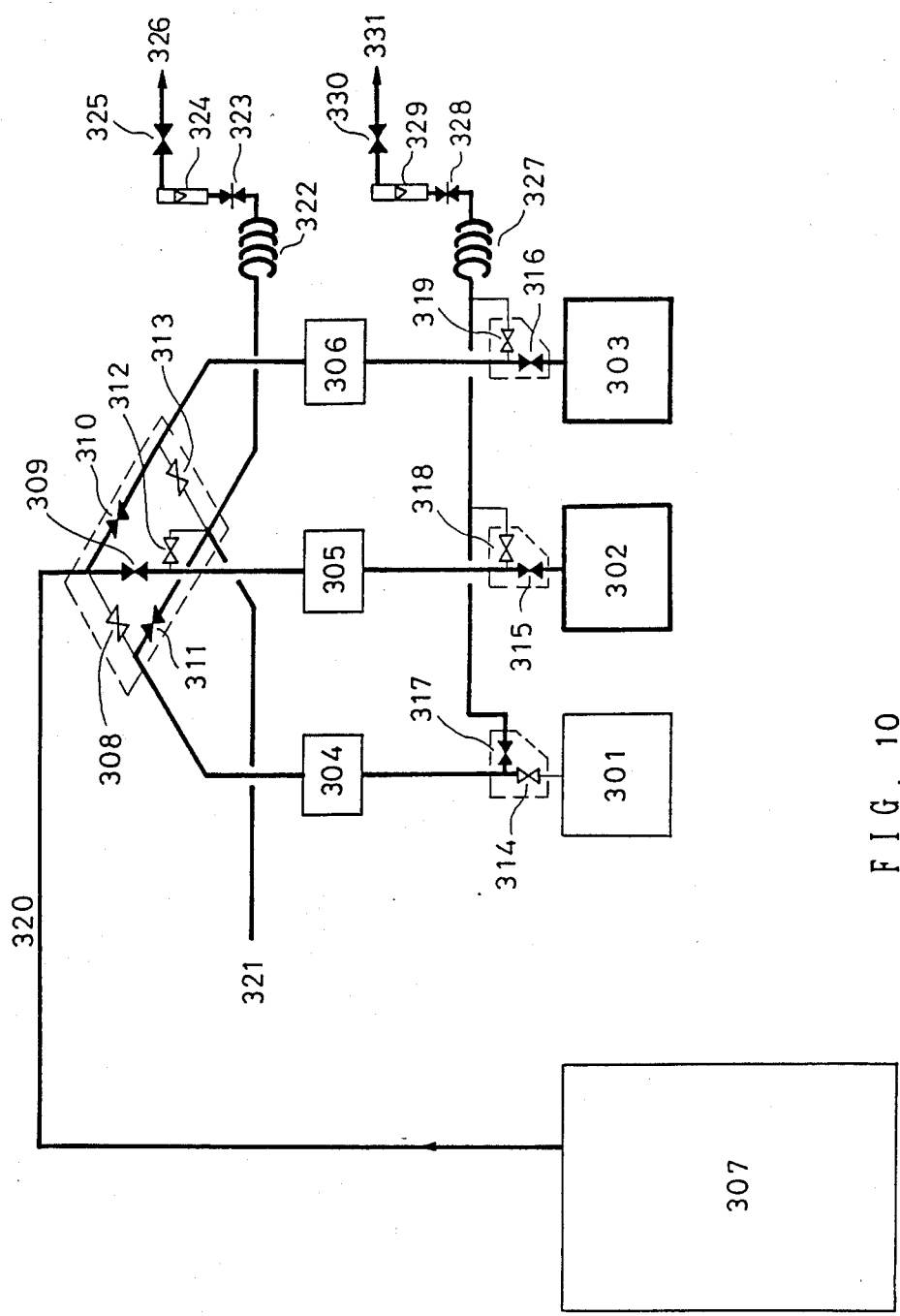

FIGS. 8, 9 and 10 indicate the flows of gas when process gas is supplied to two process units at the same time.

FIG. 8 show the flow of gas when process gas is supplied to the process units 301 and 302. With the valves 308, 309, 314 and 315 opened and the valves 310, 317 and 318 closed, process gas is supplied from 307 through 304 and 305 to 301 and 302. With the valves 313, 319 and 330 opened and the valve 316 closed, purge gas is sent to the purge gas exhaust lines 326 and 331 at the flow rate of 1 liter/min. or more.

FIG. 9 shows the flow of gas when process gas is supplied to the process units 301 and 303. With the valves 308, 310, 314 and 316 opened and the valves 309, 317 and 319 closed, process gas is sent from 307 through 304 and 306 to 301 and 303. With the valves 312 and 330 opened and the valve 315 closed, purge gas is sent to the purge gas exhaust lines 326 and 331 at the flow rate of 1 liter/min. or more.

FIG. 10 shows the flow of gas when process gas is supplied to the process units 302 and 303. With the valves 309, 310, 315 and 316 opened and the valves 308, 318 and 319 closed, process gas is sent from 307 through 304 and 305 to 302 and 303. With the valves 311, 317 and 330 opened and the valve 314 closed, purge gas is sent to the purge gas exhaust lines 326 and 331 at the flow rate of 1 liter/min. or more.

In this way, when process gas is supplied to two process units at the same time, gas is sent all the time to process gas supply piping line and purge gas supply piping line to prevent the stagnation of gas. When process gas is sent to two process units at the same time and one of the process gas flows is to be stopped, the flow of gas should be in accordance with FIGS. 5 or 6 in case of FIG. 8, with FIGS. 5 or 7 in case of FIG. 9, and with FIGS. 6 or 7 in case of FIG. 10. However, this procedure should be performed only after process gas has been completely released because process gas may reversely flow into the purge gas supply piping line if process gas remains under positive pressure in the line with process gas stopped.

Figure 11:
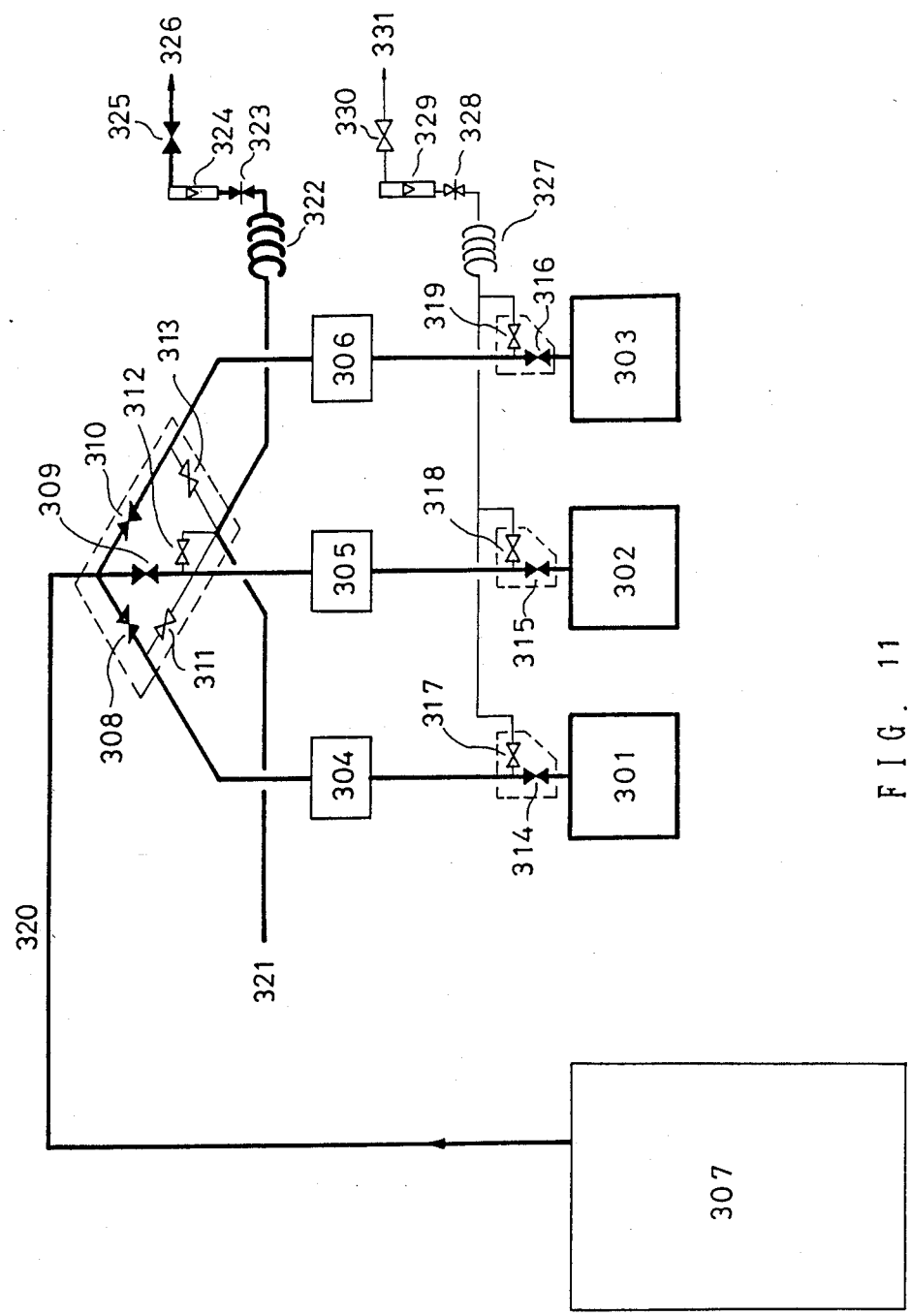

FIG. 11 illustrates the flow of gas when process gas is supplied to three process units 301, 302 and 303 at the same time. With the valves 308, 309, 310, 314, 315 and 316 opened and the valves 311, 312, 313, 317, 318 and 319 closed, process gas is sent from cylinder cabinet piping system 307 through process gas supply piping line 320, and control units 304, 305 and 306 to the process units 301, 302 and 303 respectively. In this case, purge gas is continuously sent with the valve 325 opened at the flow rate of 1 liter/min. to prevent the stagnation of gas in the purge gas supply piping line and to eliminate the contamination due to the released gas from internal walls of the piping materials. If the supply of process gas is to be stopped to one or two of the process units, the procedure in accordance with FIGS. 5, 6, 7, 8, 9 or 10 should be performed respectively in order to maintain the flow of gas to process gas supply piping line and purge gas supply piping line all the time. Also, special care should be taken not to pass the process gas to purge gas supply piping line.

The mono-block valve, combining 6 valves in one integral unit, differs according to the number of process units, to which the gas is supplied from one gas cylinder. FIG. 1 shows the structure of a valve, supplying process gas to three process units.

Figure 3A:
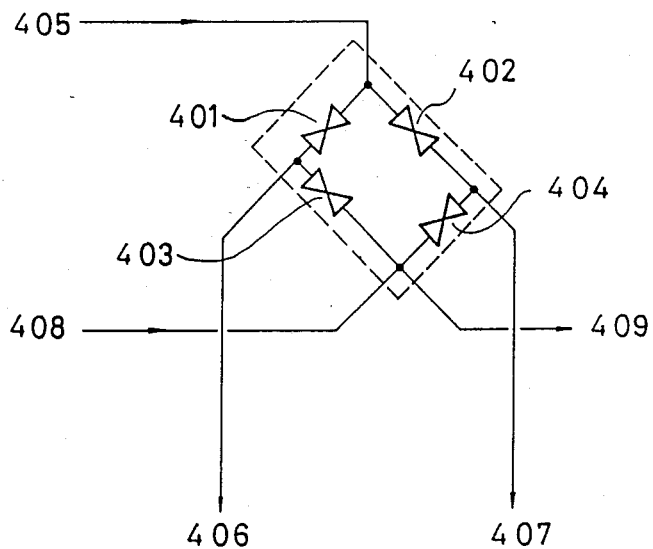
FIG. 3(a) shows the structure of a mono-block valve when gas is supplied to two process units in a process gas supply piping system according to FIG. 1, and FIG. 3(b) give the structure of mono-block valve when gas is supplied to four process units in a process gas supply piping system shown in FIG. 1.
Figure 3B:
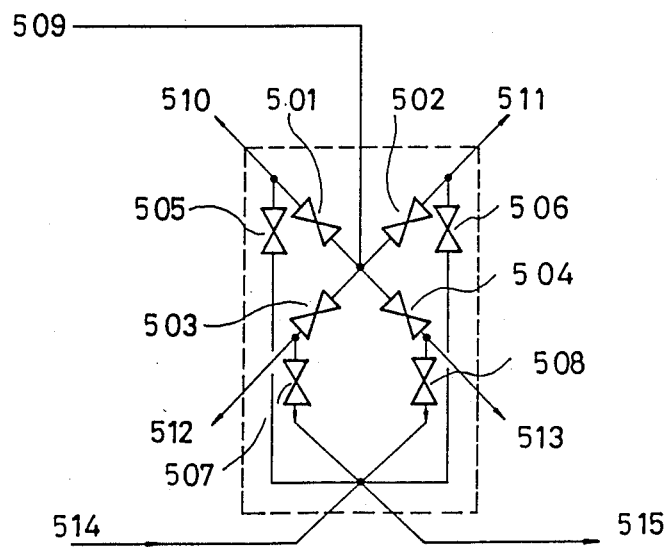

FIG. 3(a) shows the structure of a mono-block valve when there are two process units to be supplied, and FIG. 3(b) shows the one when there are four process units. In the following, description is given in conjunction with these figures.

In FIG. 3(a), 401, 402, 403 and 404 indicate stop valves. They are a mono-block valve, in which four valves are combined together in one integral unit to minimize the stagnation of gas. 405 is a process gas supply piping line, and 406 and 407 are the lines to supply process gas to each process unit. 408 is a purge gas supply piping line, and 409 is a purge gas exhaust line.

In FIG. 3(b), 501, 502 503, 504, 505, 506, 507 and 508 are stop valves. They are a mono-block valve, where 8 valves are combined together in one integral unit. 509 represents a process gas supply piping line, and 510, 511, 512 and 513 indicate the lines to supply process gas to each of the process units. 514 is a purge gas supply piping line, and 515 is a purge gas exhaust line. The operating procedure is similar to that of the mono-block valve shown in FIG. 1. Thus, the structure of mono-block valve is determined according to the number of the process units. Adjustment may be made to cope with the future installation increase. The making of a mono-block valve from two or more valves is not only effective for the improvement of performance in gas piping system but also gives dramatic effects to provide more compact design for the entire system.

A valve is used to separate the process gas supply piping line from the purge gas supply line. Usually, the valve seat leak (through-leak) of the stop valve, guaranteeing 1 million times or more of opening/closing operation, is about $1 \times 10^{-9}$ Torr liter/sec. Even when purge gas may be mingled into the process gas supply piping line in this order, its concentration is several ppb or less, and the influence to the process is extremely low. However, if even such small degree of leak is not satisfactory for the separation, double separation may be adopted by installing each of these stop valves in double.

Figure 12:
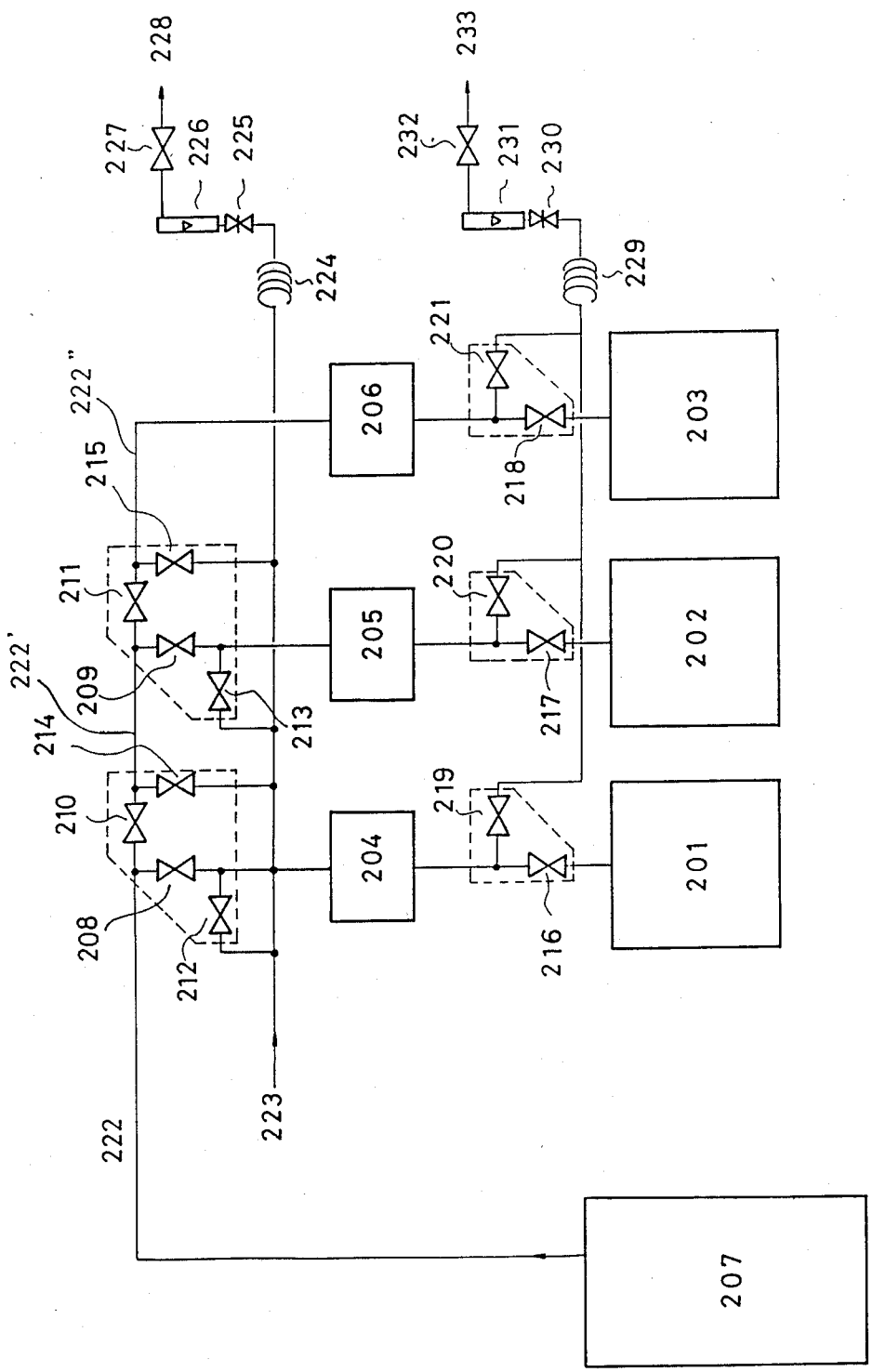
FIG. 12 shows the embodiment 2 of the process gas supply piping system according to the invention.

FIG. 12 is a piping diagram of the gas supply piping system to illustrate another embodiment according to the present invention, which is an improved modification of the conventional system shown in FIG. 1. 201, 202 and 203 are the process units. 204, 205 and 206 indicate the control units to control the supply pressure, flow rate, etc. of the process gas. 207 is a cylinder cabinet piping system to accommodate process gas cylinder and to supply process gas. 208, 209, 210, 211, 212, 213, 214, 215, 216, 217, 218, 219, 220, 221, 227 and 232 are stop valves. Of these valves, 208, 210, 212 and 214, and 209, 211, 213 and 215 are the mono-block valves, in each of which four valves are combined together in one integral unit in order to minimize gas stagnation. 216 and 219, 217 and 220, and 218 and 221 are the two-throw three-way valves, in each of which two valves are combined together in one integral unit. 222, 222' and 222" are the process gas supply piping lines, and 223 is a supply piping line of purge gas such as Ar. 228 and 233 are the purge gas exhaust line and are normally fabricated of ¼" or ⅜" internally electro-polished SUS316L pipe depending upon the quantity of the flowing gas. 224 and 229 are the spiral pipes with sufficient length to prevent the mingling of atmospheric air into each of the lines through exhaust outlet by back-diffusion. 225 and 230 are needle valves, and 226 and 231 are flowmeters. The purge gas exhaust system, consisting of 224, 225 and 226, and of 229, 230 and 231, should have the same function as the one shown in FIG. 4, and the purge gas is sent from the purge gas supply piping line 223 through 224, 225, 226 and 227 at the flow rate of 1 liter/min. all the time to prevent gas stagnation in the piping system. For the purge gas exhaust line 233, only one line is shown in the figure to facilitate the explanation, but three lines may be independently furnished.

Next, the operation of the system shown in FIG. 12 is described. The lines with flowing gas are shown by thick, black lines.

Figure 13:
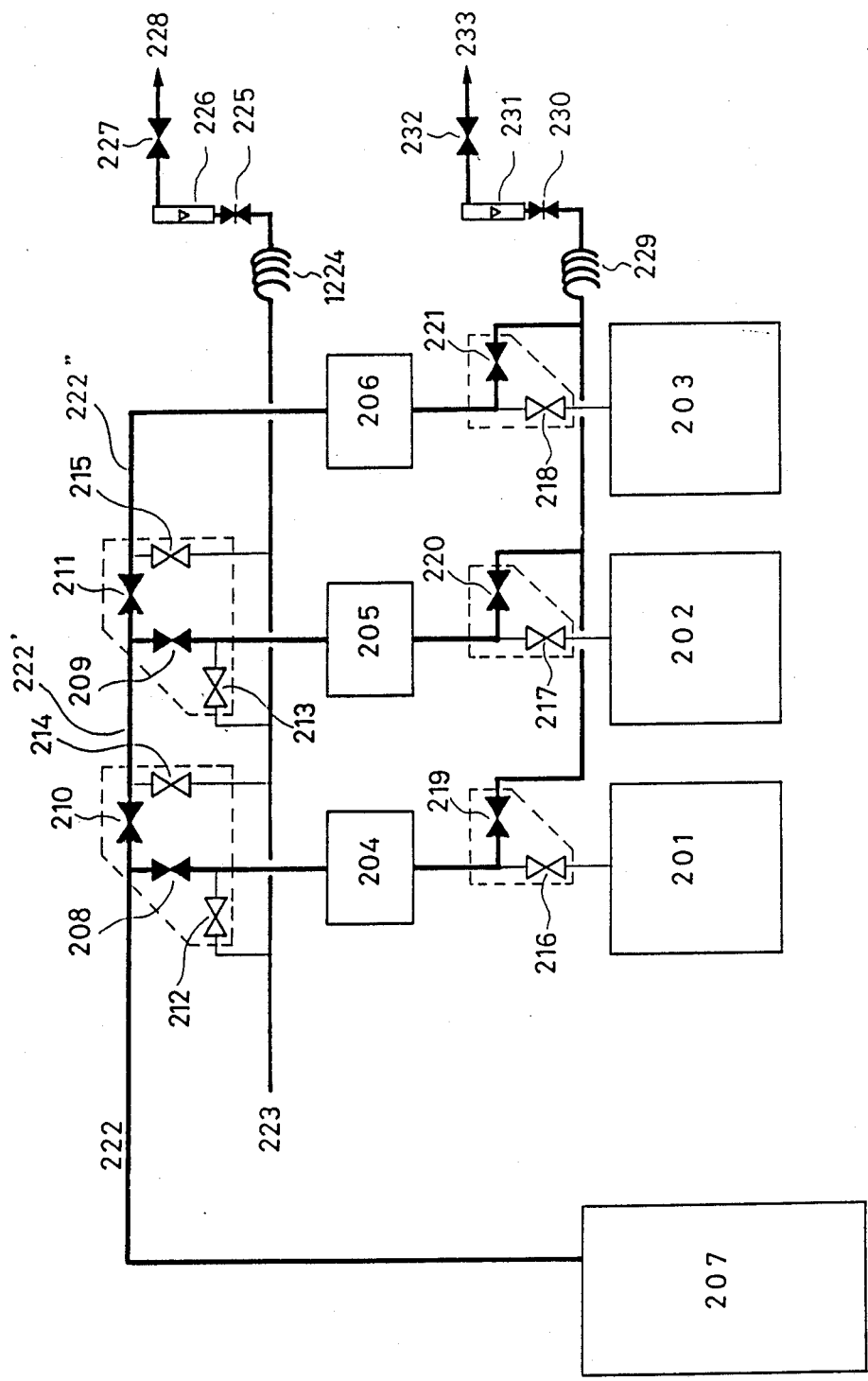
FIGS. 13 to 20 are the drawings to illustrate the operations in the process gas supply piping system according to the present invention and shown in FIG. 12.

FIG. 13 illustrates the flow of gas when all process units are stopped. With the valves 208, 210, 209, 211, 219, 220, 221 and 232 opened and the valves 212, 214, 213, 215, 216, 217 and 218 closed, purge gas is sent from the cylinder cabinet piping system through the process gas supply piping lines 222, 222' and 222" and through control units 204, 205 and 206 respectively to the purge gas exhaust line 233 at the flow rate of 1 liter/min. or more in order to prevent the contamination due to the gas stagnation in the piping system.

Figure 14:
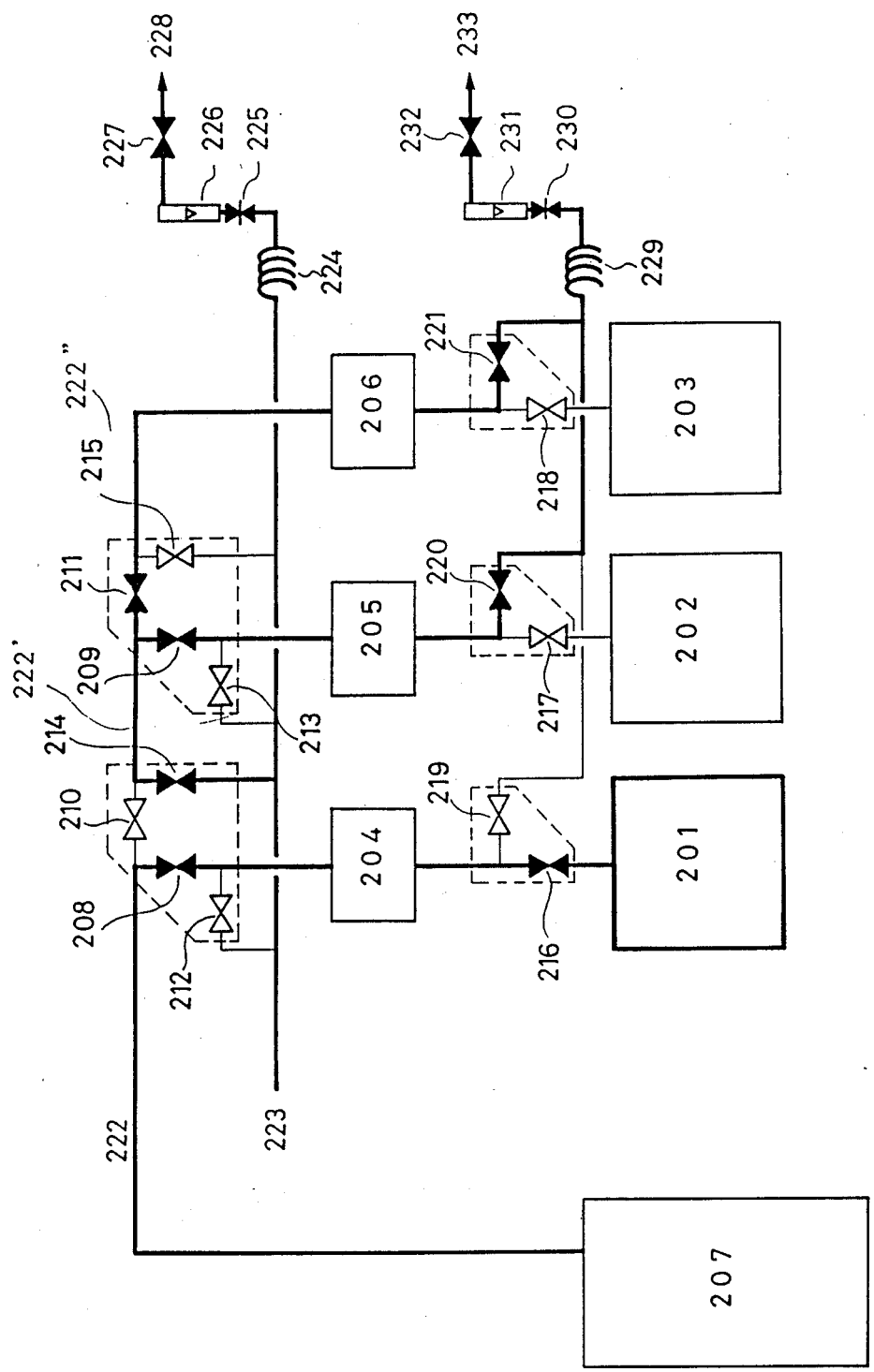

FIG. 14 shows the flow of gas when process gas is supplied to the process unit 201 only. With the valves 208 and 216 opened and the valves 210, 212 and 219 closed, process gas is supplied from the cylinder cabinet piping system 207 through the process gas supply piping line 222 and the control unit 204 to the process unit 201. On the other hand, with the valves 214, 209, 211, 220, 221 and 232 opened and the valves 213, 215, 217 and 218 closed, purge gas is sent from the purge gas supply piping line 223 through the process gas supply piping lines 222' and 222" of the other process units as well as through the control units 205 and 206 to the purge gas exhaust line 233 at the flow rate of 1 liter/min. or more to prevent the gas stagnation in the gas supply line.

FIG. 15 shows the flow of gas when process gas is supplied only to the process unit 202. With the valves 210, 209 and 217 opened and the valves 208, 214, 213, 211 and 220 closed, process gas is supplied from the cylinder cabinet piping system 207 through the process gas supply piping lines 222 and 222' and the control unit 205 to the process unit 202. On the other hand, with the valves 212, 215, 219, 221 and 232 opened and the valves 216 and 218 closed, purge gas is sent from the purge gas supply piping line 223 through the control units 204 and 206 to the purge gas exhaust line 233 at the flow rate of 1 liter/min. or more to prevent the gas stagnation in the gas supply line.

Figure 16:
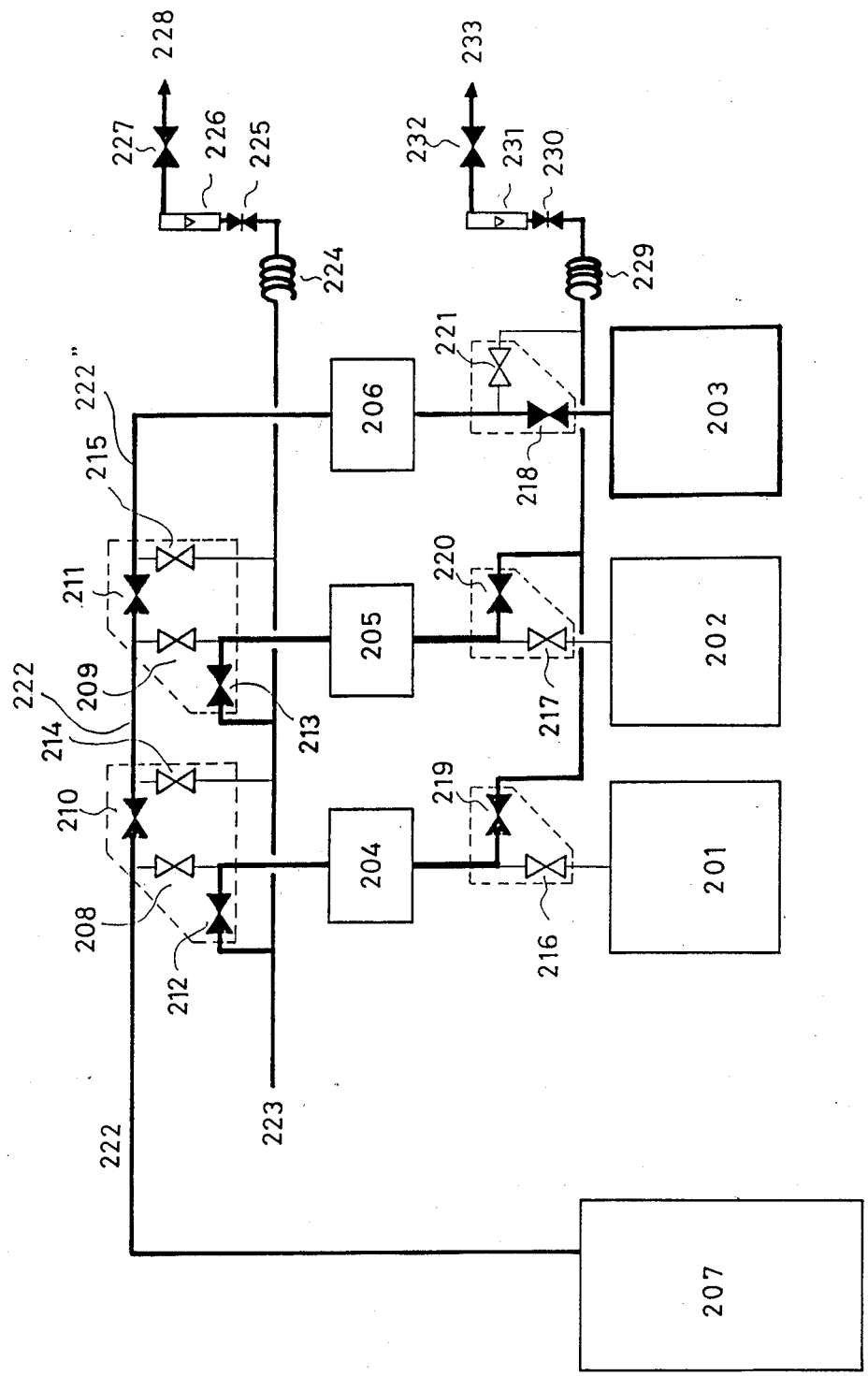

FIG. 16 gives the flow of gas when process gas is supplied to the process unit 203 only. With the valves 210, 211 and 218 opened and the valves 208, 214, 209, 215 and 221 closed, process gas is supplied from the cylinder cabinet piping system 207 through the process gas supply piping lines 222, 222' and 222" and through the control unit 206 to the process unit 202. On the other hand, with the valves 212, 213, 219, 220 and 232 opened and the valves 216 and 217 closed, purge gas is sent from the purge gas supply piping line 223 through the control units 204 and 205 to the purge gas exhaust line 233 at the flow rate of 1 liter/min. or more to prevent the gas stagnation in the gas supply line.

Next, description is given for the case where process gas is supplied to two process units.

Figure 17:
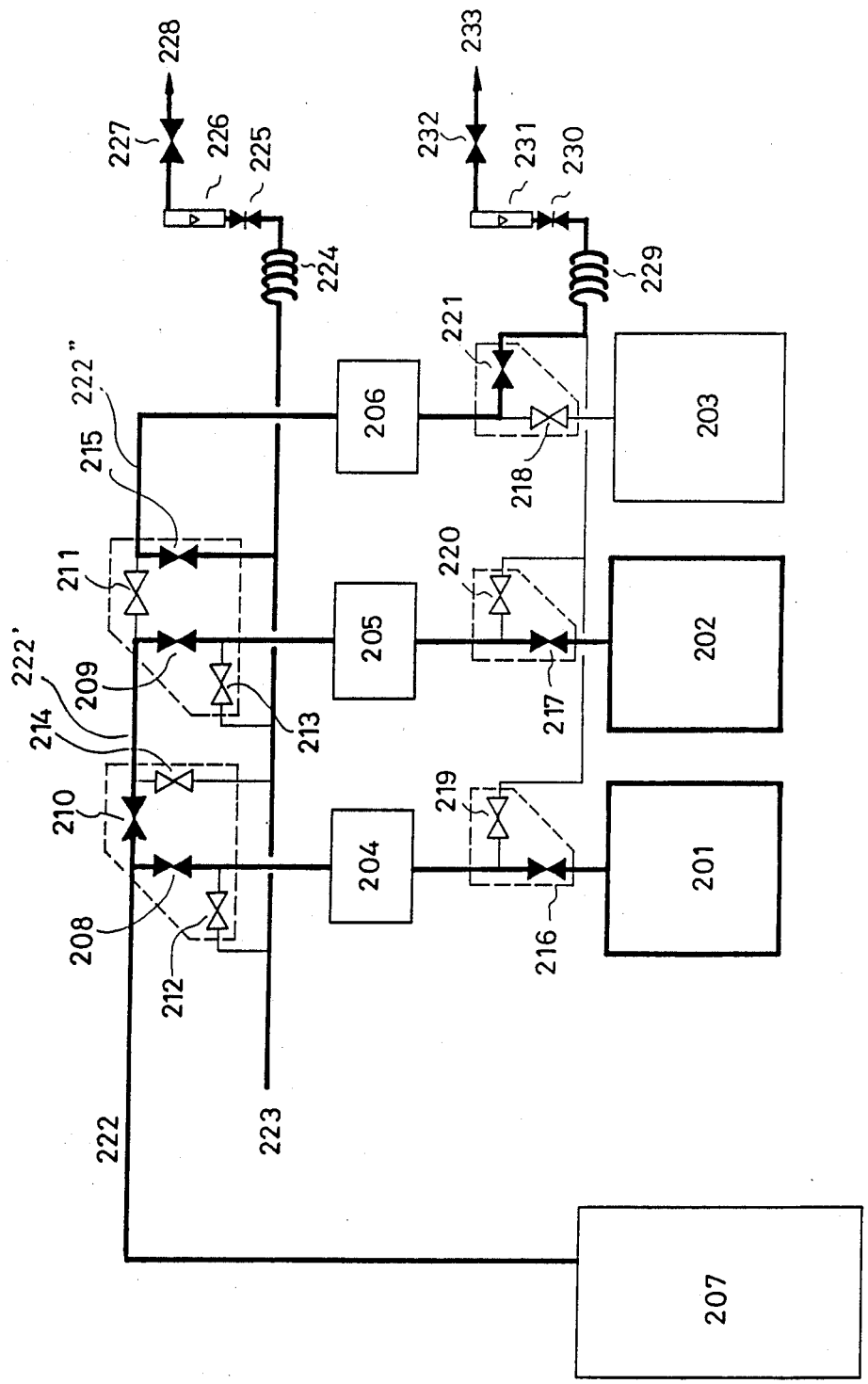

FIG. 17 shows the flow of gas when process gas is supplied to the process units 201 and 202 at the same time. With the valves 208, 210, 209, 216 and 217 opened and the valves 212, 214, 213, 211, 219 and 220 closed, process gas is supplied from the cylinder cabinet piping system 207 through the process gas supply piping lines 222 and 222' and the control units 204 and 205 to the process units 201 and 202. On the other hand, with the valves 215, 221 and 233 opened and the valve 218 closed, purge gas is sent through the process gas supply piping line 222" of the process unit 203 and through the control unit 206 to the purge gas exhaust line 233 to prevent the gas stagnation in this line.

Figure 18:
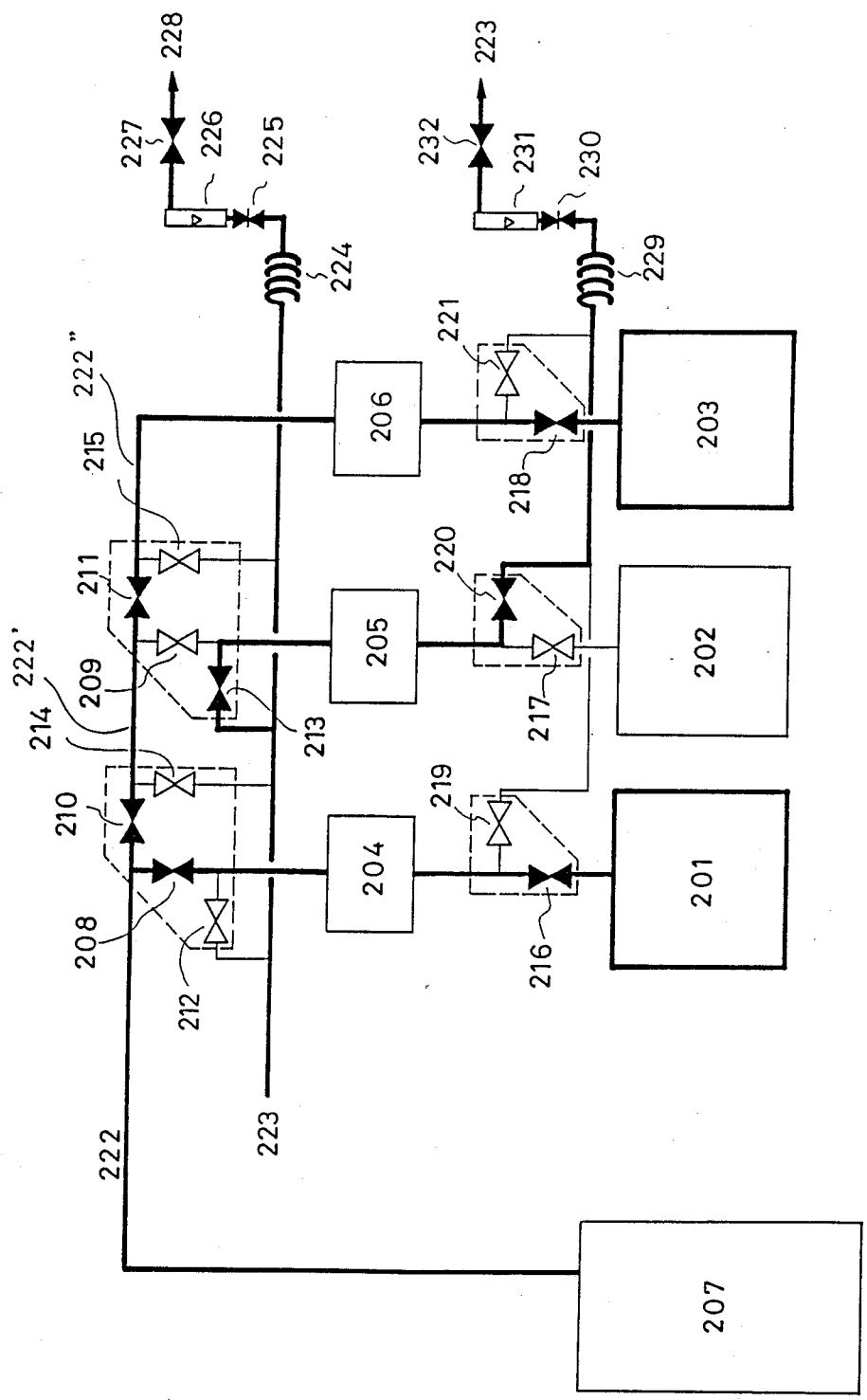

FIG. 18 shows the flow of gas when process gas is supplied to the process units 201 and 203 at the same time. With the valves 208, 210, 211, 216 and 218 opened and the valves 212, 214, 209, 215, 219 and 221 closed, process gas is supplied from the cylinder cabinet piping system 207 to the process units 201 and 203. On the other hand, with the valves 213, 220 and 232 opened and the valve 217 closed, purge gas is sent through the control unit 205 to the purge gas exhaust line 233 to prevent the gas stagnation.

Figure 19:
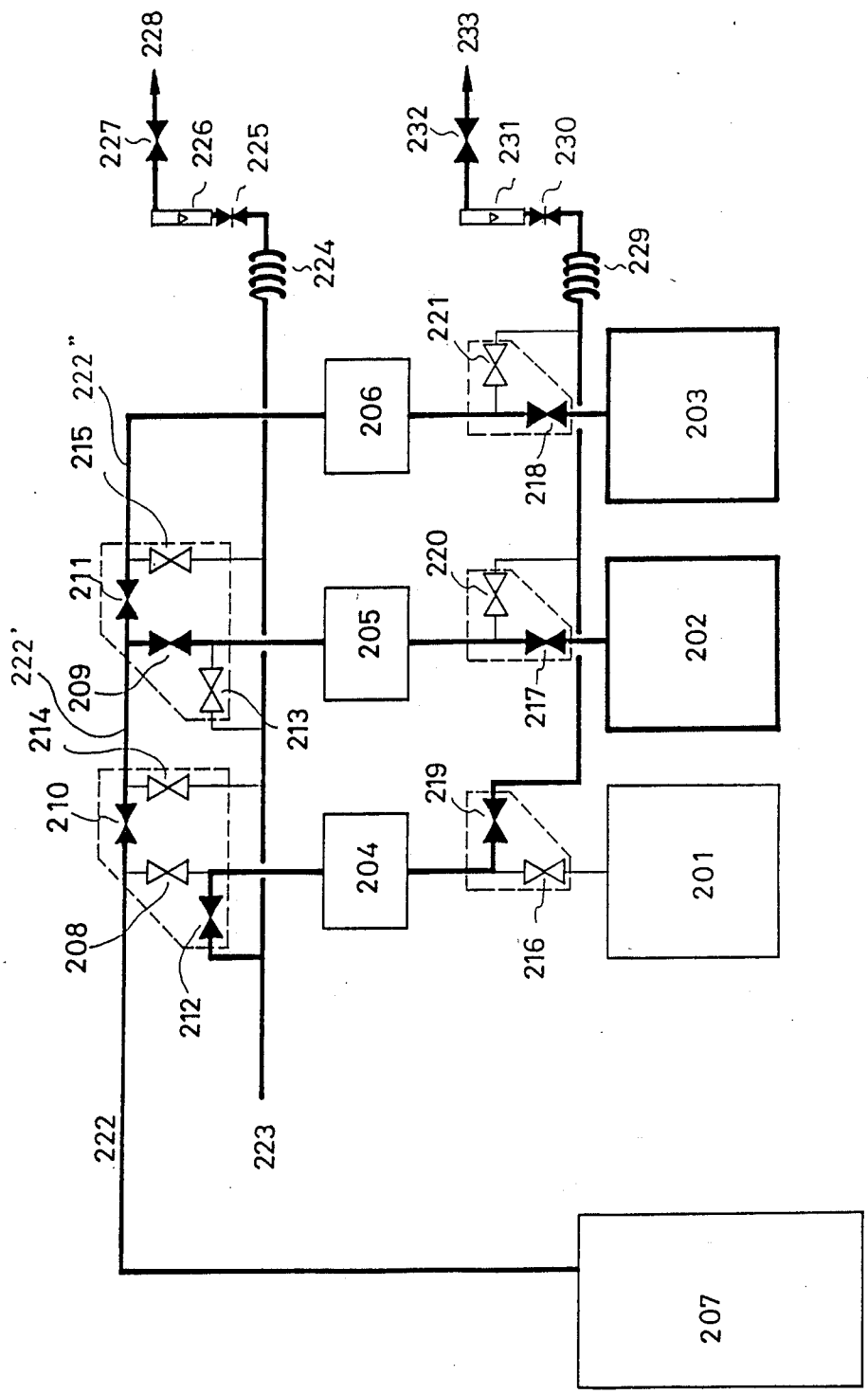

FIG. 19 shows the flow of gas when process gas is supplied to the process units 202 and 203 at the same time. With the valves 210, 209, 211, 217 and 218 opened and the valves 208, 214, 213, 215, 220 and 221 closed, process gas is supplied from cylinder cabinet piping system 207 through the process gas supply piping lines 222, 222' and 222" as well as through the control units 205 and 206 to the process units 202 and 203. On ther other hand, with the valves 212, 219 and 232 opened and the valve 216 closed, purge gas is sent from the purge supply piping line 223 through the control unit 204 to the purge gas exhaust line 233 to prevent the gas stagnation.

Process gas is, of course, supplied to two process units at the same time. When the gas supply is to be stopped to one of the units, the procedure should be in accordance with the FIGS. 14, 15 and 16.

Figure 20:
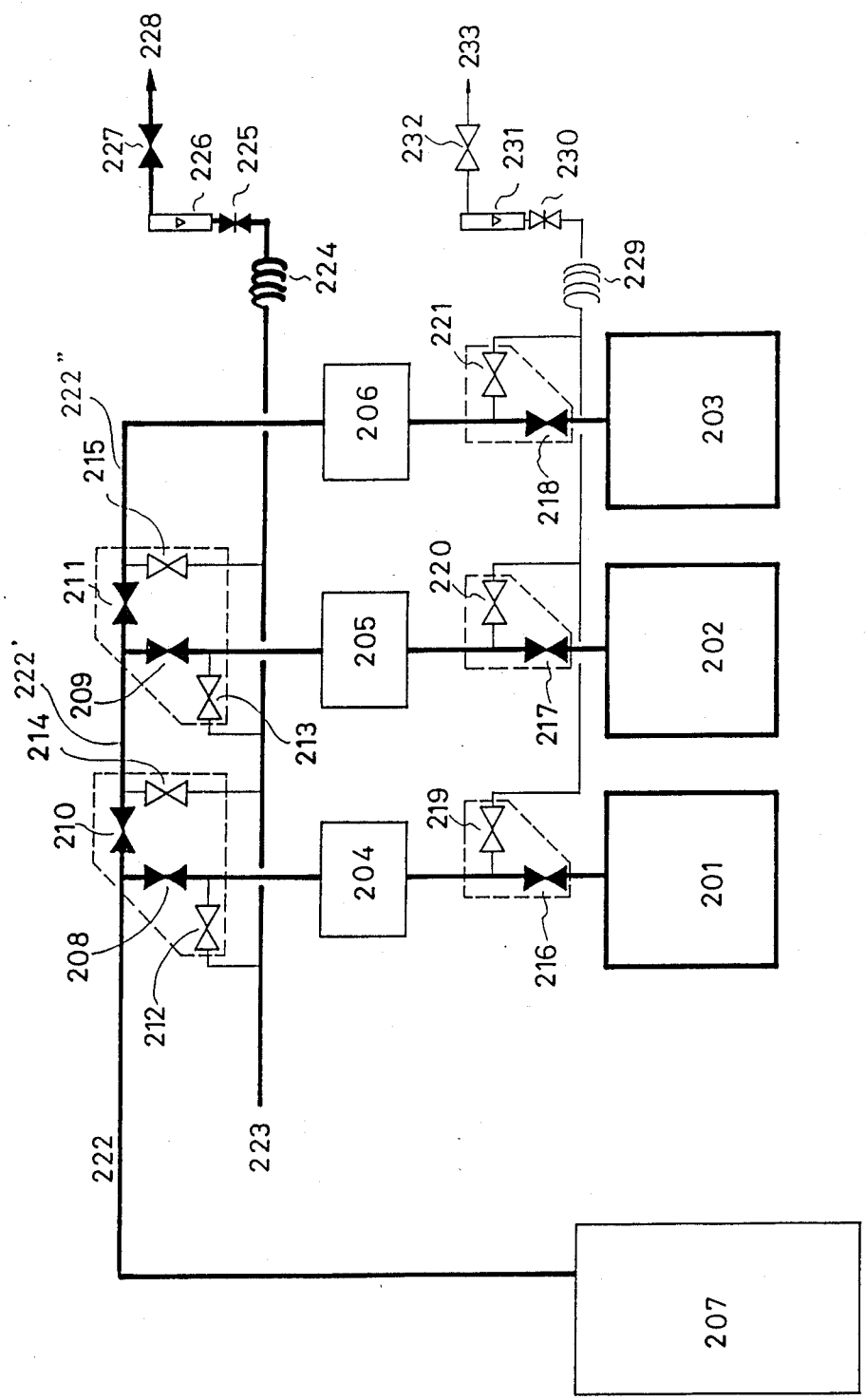
Figure 21:
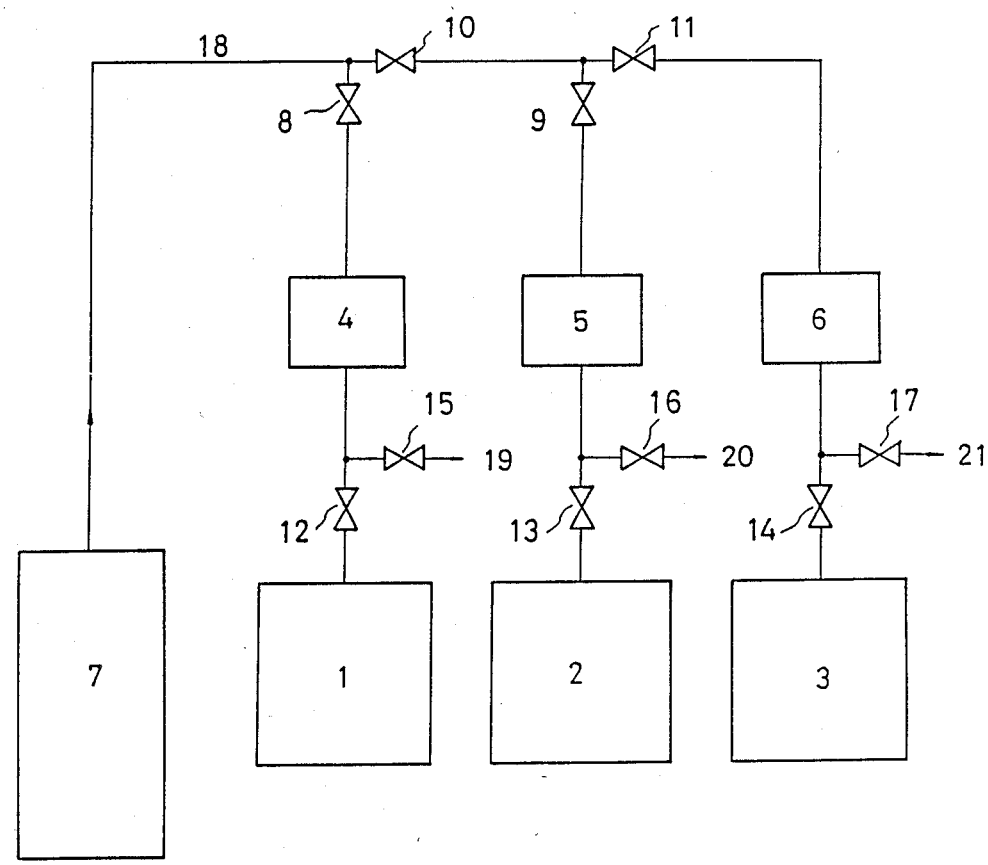
FIG. 21 shows an example of the conventional process gas supply piping system.
Figure 22:
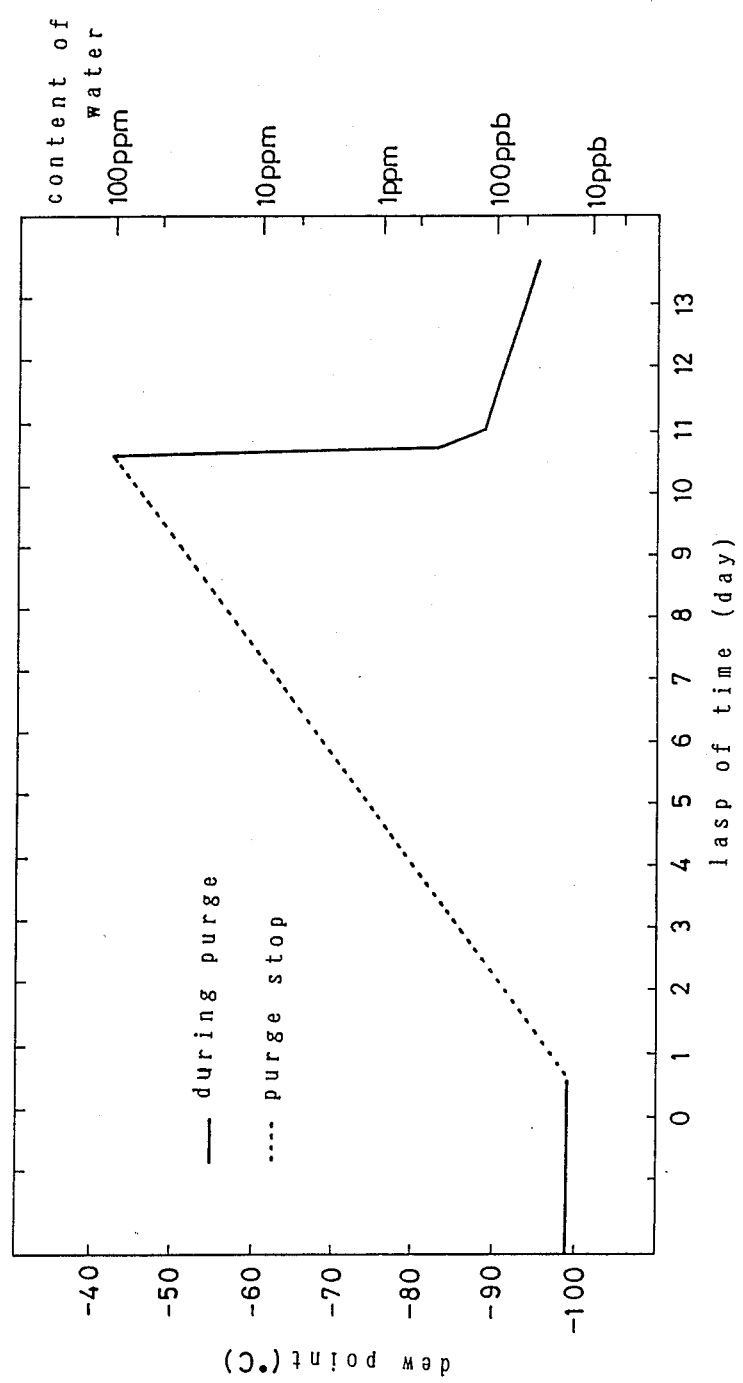
FIG. 22 is a graphic representation of the results of measurement on the changes of dew point in the conventional process gas supply piping system.

Finally, FIG. 20 shows the flow of gas when gas is supplied to three process units 201, 202 and 203 at the same time. With the valves 208, 210, 209, 211, 216, 217 and 218 opened and the valves 212, 214, 213, 215, 219, 220, 221 and 231 closed, process gas is supplied from the cylinder cabinet piping system 207 through the process gas supply piping lines 222, 222' and 222" and the control units 204, 205 and 206 to each of the process units 201, 202 and 203. As described above, purge gas is sent at the flow rate of 1 liter/min. or more all the time with the valve 227 opened in order to prevent the gas stagnation and the mingling of atmospheric air from exhaust system by back-diffusion in order to eliminate the contamination in the piping system.

Compared with the system shown in FIG. 1, where the pipings are branched off from the same point on the process gas supply piping line to two or more process units, the system shown in FIG. 12 requires fewer types of component parts and is advantageous in the installation cost because the pipings are branched off one after another from the process gas supply piping line to each of the process units. As it is evident from FIG. 12, only one type of mono-block valve, integrating four valves in one unit, is required to supply the gas to two or more process units.

In the above, the piping systems shown in FIGS. 1 and 12 were described as the embodiments of the present invention. It should be understood that the invention is not limited to the exact details of the systems shown and described herein. The present invention can also be applied to the purge gas lines and the process gas supply lines where ga is supplied from one gas cylinder to different number of process units or where the supply procedure of process gas or the purging procedure of the supply line differs from those of the systems shown herein.

The above explanation is given for the cases where the so-called special gases such as $SiH_4$, $SiH_6$, $SiCl_4$, $CCl_4$, $CF_4$, $CF_2Cl_2$, $WF_6$, $NF_3$, $AsH_3$, $PH_3$ and $B_2H_6$ filled in gas cylinder are supplied to two or more process units. However, it should be understood that the invention can also be applied to the process gas supply piping system of the process gas—the so-called general gases such as $Ar$, $H_2$, $O_2$ and $He$. Particularly, the process gases such as $N_2$, $Ar$ and $H_2$ are usually supplied by branching off to each of the units after passing through a large size purifier. The similar procedure is also adopted for $O_2$ and $He$. Therefore, the invention can be applied not only to the process gases supplied in gas cylinder but also to the process gases supplied from liquefied gas tank or from on-site plant.

Effects of the Invention

As described above, the present invention provides a technique to design and construct a piping system where no stagnation of gas occurs. If the gas used for purging has very high purity, such purity of the gas in gas cylinder is maintained and can be supplied to the process units at any time.

For the process gases such as $SiH_4$, $Si_2H_6$, $SiCl_4$, $CCl_4$, $CF_4$, etc., moisture content of less than 5 ppb can be held at the process units, and this provides much conveniences for the production of highly selective thin films at low temperature and for the efficient etching.

Thus, the invention actualizes a total and clean supply system of raw material gases to facilitate the production of high quality thin films and high quality etching.

We claim:

1. A process gas supply system for supplying process gas to at least two process units, comprising:
   a purge gas supply piping line;
   a process gas supply piping line including at least one branching point;
   a plurality of process unit piping lines and associated process units, each said process unit piping line connected to said at least one branching point, each said process unit piping line connecting an associated said process unit to said process gas supply line; and
   valve means for connecting said process gas supply line, said purge gas supply piping line, and at least one of said process unit piping lines to said at least one branching point, said valve means including at least four valves, whereby each one of said process unit piping lines can be independently purged and said process gas supply system can simultaneously supply process gas through at least one of said valves to an associated process unit currently in use, and purge process unit piping lines currently not in use through at least one of said valves without stagnating either the process gas or the purge gas within the piping system in any mode of operation.

2. The process gas supply piping system as set forth in claim 1, wherein said at least four valves include a first valve located in said process unit piping line downstream from said branching point, a second valve located in said process gas supply piping line downstream from said branching point, a third valve connecting said purge gas piping line to said process unit piping line at a point located in said process unit piping line between said first valve and said process unit, and a fourth valve connecting said purge gas piping line from a point downstream from said third valve to said process gas supply piping line at a point downstream from said second valve.

3. The process gas supply piping system as set forth in claim 2, wherein said valve means for connecting said process gas supplying piping line, said purge gas piping line, and said plurality of process unit piping lines includes at least twice as many valves as said plurality of process unit piping lines.

4. The process gas supply piping system as set forth in claim 3, wherein said process gas supply piping line includes a plurality of branching points, a respective plurality of process unit piping lines branched off each said respective branching point, a valve means for connecting said process gas supply line, said purge gas supply line, and a respective plurality of process unit piping lines to each respective said branching point, said valve means at each respective said branching point including at least twice as many valves as said process unit piping lines branched off each respective said branching point, at least one-half said valves at each respective said branching point connecting said process gas supply piping line to said plurality of process unit piping lines branched off each respective said branch point, and at least one-half said valves at each respective said branching point connecting said purge gas piping line to said plurality of process unit piping lines branched off each respective said branching point.

5. The process gas supply piping system as set forth in claim 4, wherein said purge gas piping line is connected to an exhaust line through at least one flow meter and at least one flow control valve.

6. The process gas supply piping system as set forth in claim 5, wherein said first, second, third, and fourth valves comprise a mono-block valve.

7. The process gas supply piping system as set forth in claim 4, wherein said first, second, third, and fourth valves comprise a mono-block valve.

8. The process gas supply piping system as set forth in claim 3, wherein said purge gas piping line is connected to an exhaust line through at least one flow meter and at least one flow control valve.

9. The process gas supply piping system as set forth in claim 8, wherein said first, second, third, and fourth valves comprise a mono-block valve.

10. The process gas supply piping system as set forth in claim 3, wherein said first, second, third, and fourth valves comprise a mono-block valve.

11. The process gas supply piping system as set forth in claim 2, wherein said purge gas piping line is connected to an exhaust line through at least one flow meter and at least one flow control valve.

12. The process gas supply piping system as set forth valves in claim 11, wherein said first, second, third, and fourth comprise a mono-block valve.

13. The process gas supply piping system as set forth in claim 2, wherein said first, second, third, and fourth valves comprise a mono-block valve.

14. The process gas supply piping system as set forth in claim 1, wherein said plurality of process unit piping lines are branched off said at least one branching point, and valve means includes at least twice as many valves as said plurality of branched off process unit piping lines.

15. The process gas supply piping system as set forth in claim 14, including a plurality of branching points, a valve means for connecting said process gas supply line, said purge gas supply line and a respective plurality of process unit piping lines to each respective said branching point, each respective said valve means at each respective branching point including at least twice as many valves as said process unit piping lines branching off each respective said branching point, at least one-half said valves at each respective said branching point connecting said process gas supply piping line to said plurality of process unit piping lines branched off each said branch point, at least one-half said valves at each respective said branching point connecting said purge gas piping line to said plurality of process unit piping lines branched off each respective said branching point.

16. The process gas supply piping system as set forth in claim 15, wherein said purge gas piping line is connected to an exhaust line through at least one flow meter and at least one flow control valve.

17. The process gas supply piping system as set forth in claim 16, wherein said first, second, third, and fourth valves comprise a mono-block valve.

18. The process gas supply piping system as set forth in claim 15, wherein said first, second, third, and fourth valves comprise a mono-block valve.

19. The process gas supply piping system as set forth in claim 14, wherein said purge gas piping line is connected to an exhaust line through at least one flow meter and at least one flow control valve.

20. The process gas supply piping system as set forth in claim 19, wherein said first, second, third, and fourth valves comprise a mono-block valve.

21. The process gas supply piping system as set forth in claim 14, wherein said first, second, third, and fourth valves comprise a mono-block valve.

22. The process gas supply piping system as set forth in claim 1, wherein said purge gas piping line is connected to an exhaust line through at least one flow meter and at least one flow control valve.

23. The process gas supply piping system as set forth in claim 22, wherein said first, second, third, and fourth valves comprise a mono-block valve.

24. The process gas supply piping system as set forth in claim 1, wherein said valve of said valve means comprise a mono-block valve.

* * * * *